US012666822B2

(12) United States Patent
Jang

(10) Patent No.: US 12,666,822 B2
(45) Date of Patent: Jun. 23, 2026

(54) DISPLAY DEVICE

(71) Applicant: Samsung Display Co., LTD., Yongin-si (KR)

(72) Inventor: Joo Nyung Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 604 days.

(21) Appl. No.: 18/096,531

(22) Filed: Jan. 12, 2023

(65) Prior Publication Data

US 2023/0389376 A1 Nov. 30, 2023

(30) Foreign Application Priority Data

May 27, 2022 (KR) ......................... 10-2022-0065098

(51) Int. Cl.
*H10K 59/131* (2023.01)
*H10K 59/35* (2023.01)
(Continued)

(52) U.S. Cl.
CPC ......... *H10K 59/131* (2023.02); *H10K 59/352* (2023.02); *H10W 72/07332* (2026.01);
(Continued)

(58) Field of Classification Search
CPC .... H10K 59/131; H10K 59/352; H10K 59/40; H10K 77/111; H10K 59/123;
(Continued)

(56) References Cited

U.S. PATENT DOCUMENTS 11,145,706 B2 10/2021 Jang
2018/0061895 A1* 3/2018 Kim ..................... H10K 59/124
(Continued)

FOREIGN PATENT DOCUMENTS

KR 1020140080240 A 6/2014
KR 1020180025382 3/2018
(Continued)

OTHER PUBLICATIONS

F.C. Carreri, et al., "HIPIMS ITO films from a rotating cylindrical cathode", Surface & Coatings Technology, vol. 290, (2016), pp. 65-72.
(Continued)

*Primary Examiner* — Steven B Gauthier
*Assistant Examiner* — Alvin L Lee
(74) *Attorney, Agent, or Firm* — CANTOR COLBURN LLP

(57) ABSTRACT
A display device includes: a substrate, a display pad disposed on the substrate, and a circuit board including an electrode facing the display pad. The display pad includes: a first pad electrode disposed on the substrate; a second pad electrode disposed on the first pad electrode, overlapping the first pad electrode in a thickness direction, and electrically connected to the first pad electrode; and insulating members spaced apart from each other with a top surface of the second pad electrode interposed therebetween, and disposed on the second pad electrode while covering opposite edges of the top surface of the second pad electrode and opposite side surfaces of the second pad electrode.

20 Claims, 27 Drawing Sheets

GAT1: 910_5
SD1: 920_5
SD2: 930_5
YMTL2: 950_5
LEL: 940_5

(51) Int. Cl.

| | |
|---|---|
| *H10W 72/00* | (2026.01) |
| *H10W 72/30* | (2026.01) |
| *H10W 72/90* | (2026.01) |
| *H10W 90/00* | (2026.01) |

(52) U.S. Cl.

CPC ........ *H10W 72/074* (2026.01); *H10W 72/354* (2026.01); *H10W 72/90* (2026.01); *H10W 72/923* (2026.01); *H10W 72/934* (2026.01); *H10W 72/9415* (2026.01); *H10W 72/9445* (2026.01); *H10W 90/734* (2026.01)

(58) Field of Classification Search

CPC ....... H10K 59/124; H01L 24/05; H01L 24/29; H01L 24/06; H01L 24/32; H01L 24/83; H01L 2224/05026; H01L 2224/05073; H01L 2224/05083; H01L 2224/05558; H01L 2224/05572; H01L 2224/05573; H01L 2224/06155; H01L 2224/2919; H01L 2224/32225; H01L 2224/83203; H01L 2224/83851

See application file for complete search history.

(56) References Cited

U.S. PATENT DOCUMENTS

| | | | | |
|---|---|---|---|---|
| 2018/0151120 | A1* | 5/2018 | Kim ................... | H10K 59/1213 |
| 2020/0356214 | A1* | 11/2020 | Kim ..................... | G06F 3/0446 |
| 2020/0403054 | A1* | 12/2020 | Jang ........................ | H01L 24/29 |

FOREIGN PATENT DOCUMENTS

| | | |
|---|---|---|
| KR | 20180061802 A | 6/2018 |
| KR | 1020200145985 | 12/2020 |
| KR | 1020210093808 | 7/2021 |
| KR | 1020210135386 | 11/2021 |

OTHER PUBLICATIONS

George Chen, et al., "Origin of thickness dependent dc electrical breakdown in dielectrics", Applied Physics Letters, (2012), vol. 100, pp. 1-5.

Joachim Hossick Schott, "Possible and practically achievable energy densities in capacitors", CARTS USA, (May 21, 2014), pp. 1-7.

S. Habermehl, et al., "Dielectric breakdown and Poole-Frenkel field saturation in silicon oxynitride thin films", Applied Physics Letters, (2005), vol. 86, pp. 1-4.

Sombel Diaham, et al., "Dielectric Breakdown of Polyimide Films: Area, Thickness and Temperature Dependence", IEEE Transactions on Dielectrics and Electrical Insulation, (Mar. 2010), pp. 18-27.

Korean Office Action—Korean Application No. 10-2022-0065098 dated Nov. 23, 2023, citing references listed within.

* cited by examiner

DISL: TFEL, EML, TFTL
GAT1: GE, CE1
GAT2: CE2
SD1: S, D
SD2: DL, CNE
YMTL1: BE1
YMTL2: RE, TE
LEL: ANO, EL, CAT

700

710   720

DR2

DR1

DR3

GAT1: 910
SD1: 920

GAT1: 910_2
SD1: 920_2

GAT1: 910_4
SD1: 920_4
SD2: 930_4
YMTL2: 940_4

GAT1: 910_5
SD1: 920_5
SD2: 930_5
YMTL2: 950_5
LEL: 940_5

GAT1: 910_6
SD1: 920_6
SD2: 930_6
YMTL2: 940_6

GAT1: 910_7
SD1: 920_7
YMTL2: 930_7

BP: BP1, BP2, BP3
PAD_1: PAD_1a, PAD_1b, PAD_1c
P: P1, P2

DISPLAY DEVICE

This application claims priority to Korean Patent Application No. 10-2022-0065098 filed on May 27, 2022, and all the benefits accruing therefrom under 35 U.S.C. § 119, the content of which in its entirety is herein incorporated by reference.

BACKGROUND

1. Technical Field

The disclosure relates to a display device.

2. Description of the Related Art

The importance of a display device has steadily increased with the development of multimedia technology. Accordingly, various types of display devices such as a liquid crystal display ("LCD") device, an organic light emitting display ("OLED") device and the like have been used.

A small semiconductor chip referred to as a display driver integrated circuit may be used to drive the display panel of the above-described display device.

The display driver integrated circuit may be attached to the substrate of the display panel by a chip on glass ("COG") method, a chip on film ("COF") method, a chip on plastic ("COP") method, or the like.

In the display device, a plurality of pixels is disposed on the substrate in the display area, and a plurality of display pads and the like are disposed on the substrate in the non-display area. A flexible film having a driving circuit and the like is coupled to the plurality of display pads to transmit a driving signal to the pixels.

The flexible film may include a plurality of lead electrodes coupled to a plurality of display pads, and the lead electrodes may be bonded to the display pads separated from each other. The bonding may be performed by an anisotropic conductive film ("ACF") disposed between the lead electrode and the display pad.

SUMMARY

Aspects of the disclosure provide a display device in which an insulating member made of a material having a high insulating property is disposed at the edge portion of a display pad, so that a short circuit that may occur between the display pad and a lead electrode due to misalignment of the display pad and the lead electrode during bonding may be prevented by a conductive ball included in an anisotropic conductive film.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device includes a substrate, a display pad disposed on the substrate, and a circuit board including an electrode facing the display pad, wherein the display pad includes a first pad electrode disposed on the substrate, a second pad electrode disposed on the first pad electrode, overlapping the first pad electrode in a thickness direction, and electrically connected to the first pad electrode, and insulating members spaced apart from each other with a top surface of the second pad electrode interposed therebetween, and disposed on the second pad electrode while covering opposite edges of the top surface of the second pad electrode and opposite side surfaces of the second pad electrode.

In an embodiment, a display device may further include an anisotropic conductive film disposed between the substrate and the circuit board and including a base resin and a conductive ball dispersed in the base resin, where the conductive ball may contain a core made of a polymer material and at least one metal layer surrounding the core, and the conductive ball may be in contact with the electrode of the circuit board comprising and the top surface of the second pad electrode exposed by the insulating members.

In an embodiment, the insulating members may be disposed to extend toward a central portion of the second pad electrode, and the insulating members may expose a central portion of the top surface of the second pad electrode.

In an embodiment, the display pad may further include a first insulating layer including at least one layer disposed between the first pad electrode and the second pad electrode, and the first insulating layer may expose a part of a top surface of the first pad electrode, and the first insulating layer may be in contact with the insulating member.

In an embodiment, a display device may further include a buffer layer disposed between the substrate and the first pad electrode, and the display pad may further include a third pad electrode disposed on the first pad electrode and in contact with the first pad electrode, and a fourth pad electrode disposed between the second pad electrode and the third pad electrode and in contact with the second pad electrode and the third pad electrode, and the first pad electrode, the second pad electrode, the third pad electrode, and the fourth pad electrode may overlap in the thickness direction, and the first pad electrode, the second pad electrode, the third pad electrode, and the fourth pad electrode may be electrically connected.

In an embodiment, the third pad electrode may be in contact with the first insulating layer, and the fourth pad electrode may extend outward from the third pad electrode to completely cover the third pad electrode.

In an embodiment, the display pad may further include a second insulating layer including at least one layer disposed between the second pad electrode and the fourth pad electrode, and the second insulating layer may expose a part of a top surface of the fourth pad electrode, and the second insulating layer may be in contact with the insulating member.

In an embodiment, the display pad may further include a fifth pad electrode disposed between the third pad electrode and the fourth pad electrode, and overlapping the first pad electrode, the second pad electrode, the third pad electrode, and the fourth pad electrode in the thickness direction while being electrically connected thereto, and the fifth pad electrode may be in contact with the third pad electrode and the fourth pad electrode.

In an embodiment, the fourth pad electrode may extend outward from the fifth pad electrode to completely cover the fifth pad electrode, and the fifth pad electrode may extend outward from the third pad electrode to completely cover the third pad electrode.

In an embodiment, at least one of thicknesses of the first pad electrode, the second pad electrode, the third pad electrode, the fourth pad electrode, and the fifth pad electrode may be different.

In an embodiment, sizes of the first pad electrode, the second pad electrode, the third pad electrode, the fourth pad electrode, and the fifth pad electrode may be different from each other.

In an embodiment, the second insulating layer may include at least one inorganic layer and at least one organic layer, and the organic layer may partially include a curved surface, and the second pad electrode disposed on the curved surface of the organic layer may partially include a curved surface.

In an embodiment, a display device may further include a buffer layer disposed between the first pad electrode and the substrate, and the display pad may further include a third pad electrode disposed between the first pad electrode and the second pad electrode and overlapping the first pad electrode and the second pad electrode in the thickness direction, a first insulating layer disposed between the first pad electrode and the buffer layer and including at least one layer, and a second insulating layer disposed between the second pad electrode and the third pad electrode and including at least one inorganic layer and at least one organic layer, and the second insulating layer may expose a part of a top surface of the third pad electrode, and the third pad electrode may be in contact with the second pad electrode, the first insulating layer, and the second insulating layer.

According to an embodiment of the disclosure, a display device includes: a display area including a thin film transistor and a non-display area disposed around the display area and including a pad area, the display device including a substrate, a first insulating layer including at least one layer disposed on the substrate, a first conductive layer disposed on the first insulating layer, a second insulating layer disposed on the first conductive layer and including at least one layer, a second conductive layer disposed on the second insulating layer, and a display pad disposed in the pad area, and the display pad includes a first pad electrode disposed on the substrate, a second pad electrode disposed on the first pad electrode, overlapping the first pad electrode in a thickness direction, and electrically connected to the first pad electrode, and insulating members covering opposite side surfaces and opposite edges of a top surface of the second pad electrode and exposing a part of the top surface of the second pad electrode.

In an embodiment, the first conductive layer may include a gate electrode of the thin film transistor in the display area and the first pad electrode disposed in the pad area, and the second conductive layer may include a source electrode and a drain electrode of the thin film transistor in the display area and the second pad electrode disposed in the pad area. In an embodiment, the display pad disposed in the pad area may further include the first insulating layer disposed between the first pad electrode and the second pad electrode, and the first insulating layer may expose a part of a top surface of the first pad electrode, and the first insulating layer may be in contact with the first pad electrode and the second pad electrode.

In an embodiment, a display device may further include a first via layer disposed on the second conductive layer in the display area, a third conductive layer disposed on the first via layer, a second via layer disposed on the third conductive layer, a light emitting element layer disposed on the second via layer and including a fourth conductive layer, and a sensing unit disposed on the light emitting element layer, and the sensing unit may include a first buffer layer, a first sensing insulating layer disposed on the first buffer layer, a fifth conductive layer disposed on the first sensing insulating layer, and a second sensing insulating layer disposed on the fifth conductive layer, and the display pad disposed in the pad area may further include a second buffer layer disposed between the substrate and the first pad electrode, a third pad electrode disposed between the first pad electrode and the second pad electrode and in contact with the first pad electrode, the second insulating layer disposed between the first pad electrode and the third pad electrode, exposing a part of a top surface of the first pad electrode, and in contact with the first pad electrode and the third pad electrode, and a fourth pad electrode disposed between the second pad electrode and the third pad electrode and in contact with the second pad electrode and the third pad electrode, and the first pad electrode, the second pad electrode, the third pad electrode, and the fourth pad electrode may overlap in a thickness direction, and the first pad electrode, the second pad electrode, the third pad electrode, and the fourth pad electrode may be electrically connected.

In an embodiment, the first conductive layer may include a gate electrode of the thin film transistor in the display area and the first pad electrode disposed in the pad area, and the second conductive layer may include a source electrode and a drain electrode of the thin film transistor in the display area and the third pad electrode disposed in the pad area, and the third conductive layer may include a data line connected to the source electrode of the thin film transistor in the display area, a connection electrode connected to the drain electrode of the thin film transistor, and the fourth pad electrode disposed in the pad area, and the fifth conductive layer may include a driving electrode and a sensing electrode of the sensing unit in the display area, and the second pad electrode disposed in the pad area.

In an embodiment, the display pad disposed in the pad area may further include the first buffer layer and the first sensing insulating layer disposed between the second pad electrode and the fourth pad electrode, and the first buffer layer and the first sensing insulating layer may be in contact with the second pad electrode, and the first sensing insulating layer may be in contact with the insulating member.

In an embodiment, the display pad may further include a fifth pad electrode disposed between the second pad electrode and the fourth pad electrode, and the fourth conductive layer may include an anode electrode of the light emitting element layer connected to the connection electrode of the display area and the fifth pad electrode disposed in the pad area, and the first buffer layer may be in contact with the fifth pad electrode while exposing a part of a top surface of the fifth pad electrode.

In accordance with the display device according to one embodiment, due to the insulating member disposed at the edge portion of the display pad, a short circuit occurrence region that may be generated between the display pad and the lead electrode due to the misalignment of the lead electrode and the display pad during bonding may be reduced by the conductive ball included in the anisotropic conductive film, so that the reliability of the display device may be effectively improved.

However, the effects of the disclosure are not limited to the aforementioned effects, and various other effects are included in the disclosure.

BRIEF DESCRIPTION OF THE DRAWINGS

The above and other aspects and features of the disclosure will become more apparent by describing in detail exemplary embodiments thereof with reference to the attached drawings, in which.

DETAILED DESCRIPTION

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

Features of each of various embodiments of the disclosure may be partially or entirely combined with each other and may technically variously interwork with each other, and respective embodiments may be implemented independently of each other or may be implemented together in association with each other.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, embodiments of the disclosure will be described with reference to the attached drawings.

Figure 1:
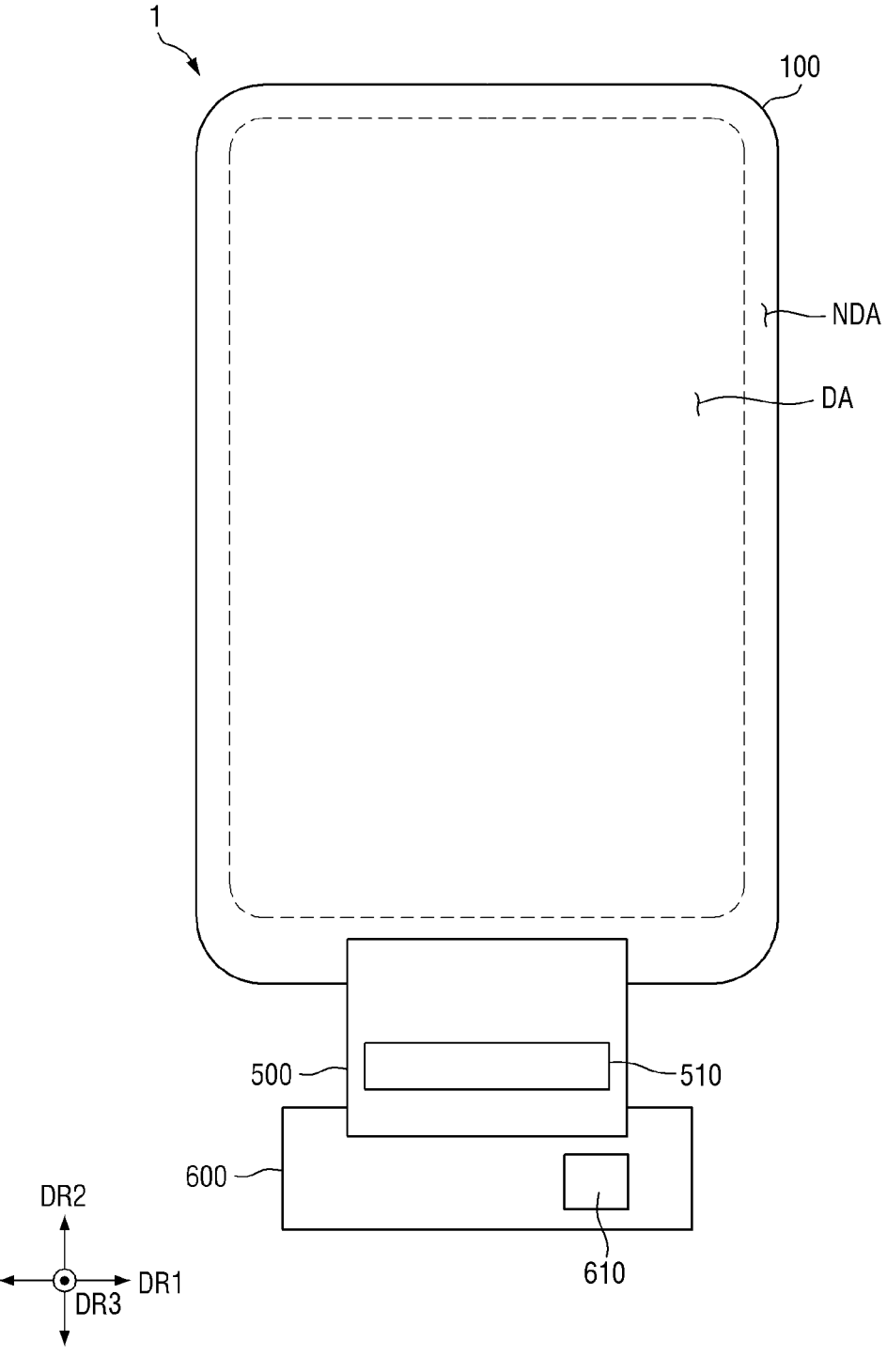
FIG. 1 is a plan view of a display device according to one embodiment.

FIG. 1 is a plan view of a display device according to one embodiment.

In the embodiments, a first direction DR1, a second direction DR2, and a third direction DR3 cross each other. The first direction DR1, the second direction DR2, and the third direction DR3 may cross other perpendicularly. For example, the first direction DR1 may be a horizontal direction, the second direction DR2 may be a vertical direction, and the third direction DR3 may be a thickness direction of the display device. The first direction DR1, the second direction DR2, and/or the third direction DR3 may include two or more directions. For example, in a cross-sectional view, the third direction DR3 may include an upward direction and a downward direction opposite to the upward direction. In this case, one surface of a member that faces upward may be referred to as top surface, and the other surface of the member that faces downward may be referred to as bottom surface. However, the directions refer to exemplary and relative directions and are not limited to the aforementioned examples.

A display device 1 is a device for displaying a moving image or a still image. The display device 1 may include various products such as televisions, laptop computers, monitors, billboards, and Internet-of-Things devices as well as portable electronic devices such as mobile phones, smart phones, tablet personal computers (tablet "PC"s), smart watches, watch phones, mobile communication terminals, electronic notebooks, electronic books, portable multimedia players ("PMP"s), navigation systems and ultra mobile PCs ("UMPC"s).

In one embodiment, an organic light emitting display panel may be applied to a display panel 100. In the following description, an organic light emitting display panel is described as an example of the display panel 100, but the disclosure is not limited thereto. For example, other types of display panels such as a liquid crystal display (LCD), a quantum dot organic light emitting display panel ("QD-OLED"), a quantum dot liquid crystal display ("QD-LCD"), a quantum nano light emitting display panel (Nano "NED"), a micro LED, and the like may be applied as the display panel 100.

The display panel 100 includes a display area DA including a plurality of pixel areas and a non-display area NDA disposed around the display area DA.

The display area DA may have a rectangular shape with right-angled or rounded corners in a plan view. Here, the plan view is a view in the third direction DR3. The display area DA may have short and long sides. The short side of the display area DA may be a side extending in the first direction DR1. The long side of the display area DA may be a side extending in the second direction DR2. However, the planar shape of the display area DA is not limited to a rectangular shape, but may have a circular shape, an elliptical shape, or various other shapes.

The non-display area NDA may be disposed adjacent to opposite the short sides and opposite the long sides of the display area DA. In this case, the non-display area NDA may surround all sides of the display area DA and form edges of the display area DA. However, the disclosure is not limited thereto, and the non-display area NDA may be disposed adjacent to opposite short sides or opposite long sides of the display area DA.

A printed circuit board 500 may be connected to the non-display area NDA of the display panel 100. One side of the printed circuit board 500 may be connected to the display panel 100, and the other side of the printed circuit board 500 may be connected to a main circuit board 600. For example, as shown in FIG. 1, in a plan view, the upper side of the printed circuit board 500 may be attached to the lower short side of the display panel 100, and the lower side of the printed circuit board 500 may be attached to the upper side of the main circuit board 600. However, the disclosure is not limited thereto, and in some embodiments, the printed circuit board 500 may be attached to the upper short side, the left long side, or the right long side of the display panel 100.

A driver integrated circuit 510 may be disposed on the printed circuit board 500. The driver integrated circuit 510 may include a driver integrated circuit 510 for driving a pixel in the display area DA. In one embodiment, the driver integrated circuit 510 may be mounted on the printed circuit board 500 by a chip on film (COF) method. However, the disclosure is not limited thereto, and in some embodiments, the driver integrated circuit 510 may be attached to the display panel 100 by a chip on glass (COG) method, a chip on plastic (COP) method, or an ultrasonic method.

The main circuit board 600 is connected to the printed circuit board 500. For example, as shown in FIG. 1, the upper side of the main circuit board 600 may be connected to the lower side of the printed circuit board 500 in a plan view.

A sensing driver 610 may be disposed on the main circuit board 600. The sensing driver 610 may be formed as an integrated circuit and attached to the top surface of the main circuit board 600. The sensing driver 610 may be electrically connected to touch electrodes of the touch sensor layer of the display panel 100 through the main circuit board 600. The sensing driver 610 may apply sensing driving signals to driving electrodes among the touch electrodes, and sense the charge variation amount of the capacitance between the driving electrodes and the sensing electrodes using sensing electrodes among the touch electrodes, thereby outputting touch data including user's touch coordinates.

Further, although not shown in FIG. 1, a power supply unit may be additionally disposed on the main circuit board 600 to supply display driving voltages for driving the driver integrated circuit 510.

Figure 2:
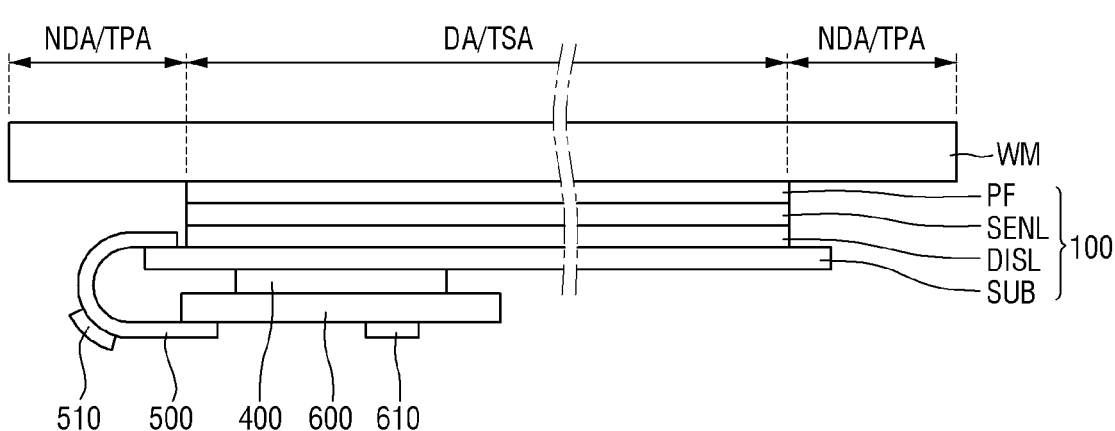
FIG. 2 is one side view showing a display panel and a display driver according to one embodiment.
Figure 2:
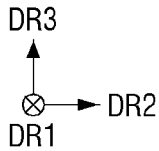

FIG. 2 is one side view showing a display panel and a display driver according to one embodiment.

Referring to FIG. 2, one side of the printed circuit board 500 may be attached to the top surface of the display panel 100 at the lower side of the display panel 100 using an anisotropic conductive film (not shown). The other side of the printed circuit board 500 may be attached to the top surface of the main circuit board 600 at the upper side of the main circuit board 600 using an anisotropic conductive film. The printed circuit board 500 may be a flexible film that can be bent. The driver integrated circuit 510 may be attached to the printed circuit board 500 by a COF method.

Referring to FIG. 2, the display panel 100 may include a display unit DISL, a sensing unit SENL, and a polarizing film PF.

The display unit DISL may include pixels, and may be a layer for displaying an image. The display unit DISL may include a substrate SUB, a thin film transistor layer on which thin film transistors are disposed, a light emitting element layer on which light emitting elements emitting light are disposed, and an encapsulation layer for encapsulating the light emitting element layer.

The display unit DISL may be divided into a display area DA and a non-display area NDA. The display area DA may be an area in which pixels are disposed to display an image. The non-display area NDA is an area in which no image is displayed. The non-display area NDA may be disposed to surround the display area DA. In the display area DA, not only pixels but also scan lines, data lines, and power lines connected to the pixels may be disposed. In the non-display area NDA, a scan driver for applying scan signals to the scan lines, signal lines connecting the data lines and the driver integrated circuit 510, and the like may be disposed.

The sensing unit SENL may be disposed on the display unit DISL. The sensing unit SENL may include sensing electrodes, and may be a layer for sensing whether or not a user has performed a touch operation. The sensing unit SENL may include a sensing area TSA and a sensing peripheral area TPA. The sensing area TSA may be an area in which the sensing electrodes are disposed to sense a user's touch input. The sensing peripheral area TPA, which is an area where the sensing electrodes are not disposed, may be disposed to surround the sensing area TSA.

The sensing area TSA of the sensing unit SENL may overlap the display area DA of the display unit DISL. The sensing peripheral area TPA of the sensing unit SENL may overlap the non-display area NDA of the display unit DISL.

The polarizing film PF for preventing a decrease in visibility of the display image of the display unit DISL due to reflection of external light may be disposed on the sensing unit SENL. The polarizing film PF may include a phase retardation film such as a linear polarizer plate and a quarter-wave (214) plate. The phase retardation film may be disposed on the sensing unit SENL, and the linear polarizer may be disposed on the phase retardation film.

A cover window WM may be disposed on the polarizing film PF. The cover window WM may be attached to the polarizing film PF by a transparent adhesive member such as an optically clear adhesive (OCA) film.

Although not shown in FIG. 2, a lower panel cover (not shown) may be disposed under the display panel 100. The lower panel cover may be attached to the bottom surface of the display panel 100 by an adhesive member. The adhesive member may be a pressure sensitive adhesive ("PSA"). The lower panel cover may include at least one of a light absorbing member for absorbing light incident from the outside, a buffer member for absorbing an impact from the outside, or a heat dissipation member for efficiently dissipating heat from the display panel 100.

The light absorbing member may be disposed under the display panel 100. The light absorbing member blocks light transmission to prevent components disposed under the light absorbing member, for example, the main circuit board 600 and the like, from being visually recognized from the upper side of the display panel 300. The light absorbing member may include a light absorbing material such as a black pigment, black dyes or the like.

The buffer member may be disposed under the light absorbing member. The buffer member absorbs an external impact to prevent the display panel 100 from being damaged. The buffer member may be formed as a single layer or multiple layers. For example, the buffer member may be formed of a polymer resin such as polyurethane ("PU"), polycarbonate ("PC"), polypropylene ("PP"), or polyethylene ("PE") or may include an elastic material such as a foamed sponge obtained from rubber, a urethane-based material, or an acrylic material.

The heat dissipation member may be disposed under the buffer member. The heat dissipation member may include a first heat dissipation layer containing graphite, carbon nanotubes or the like, and a second heat dissipation layer formed of or including a metal thin film containing, for example, copper, nickel, ferrite, or silver which can shield electromagnetic waves and has excellent thermal conductivity.

As shown in FIG. 2, the printed circuit board 500 may be disposed in the non-display area NDA at one edge of the display panel 100. For example, the printed circuit board 500 may be disposed in the non-display area NDA at the lower edge of the display panel 100. The printed circuit board 500 may be bent to be positioned under the display panel 100, and may be attached to one edge of the main circuit board 600 disposed on the bottom surface of the display panel 100. The main circuit board 600 may be attached and fixed to the bottom surface of the display panel 100 by a first adhesive member 400. The first adhesive member 400 may be a pressure sensitive adhesive.

As shown in FIG. 2, when the sensing unit SENL is directly disposed on the display unit DISL, it is advantageous in that the thickness of the display device 1 may be reduced compared to when a separate touch panel including the sensing unit SENL is attached to the display unit DISL.

Figure 3:
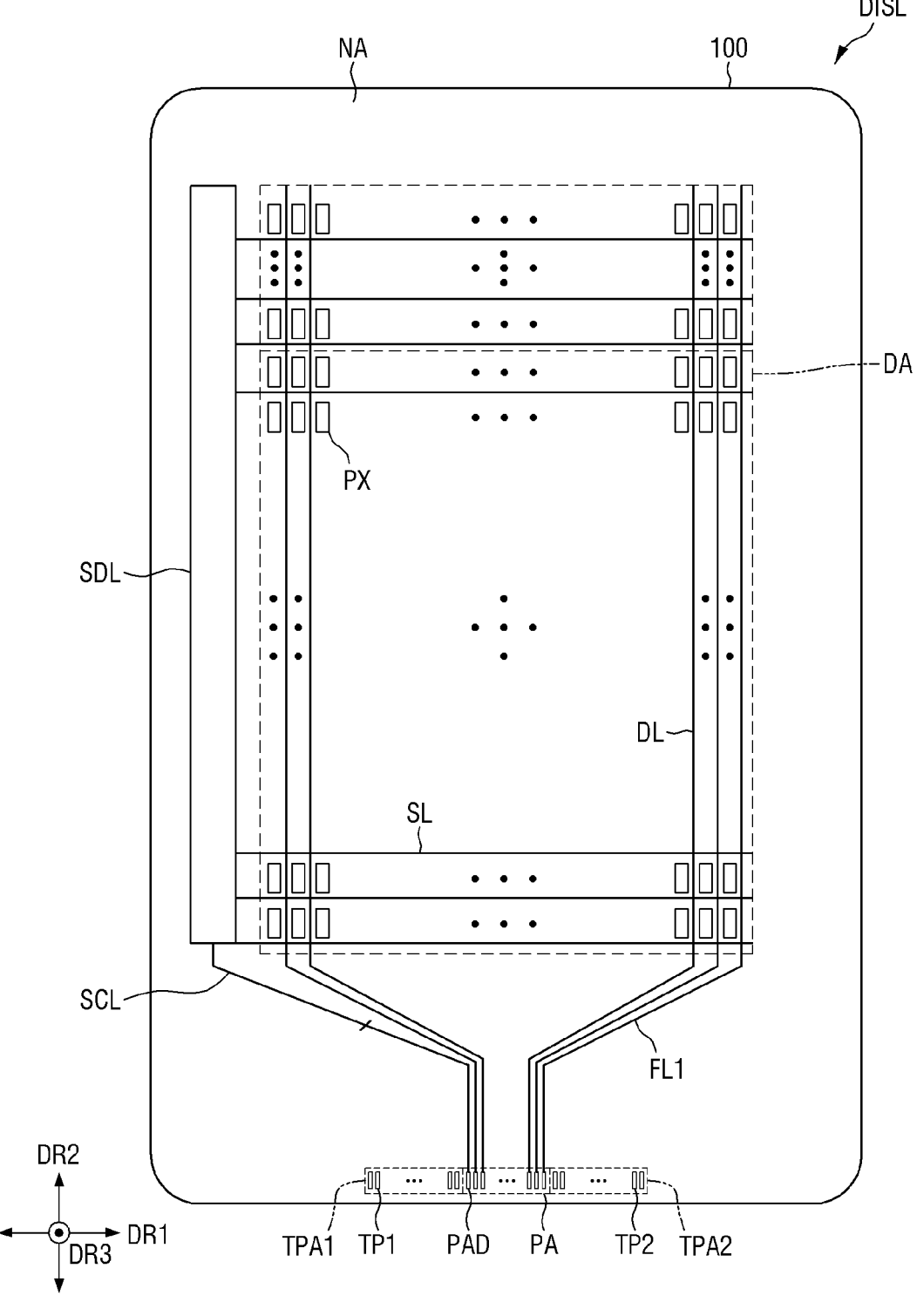
FIG. 3 is a plan view illustrating components related to the display unit of FIG. 2 according to one embodiment.

FIG. 3 is a plan view illustrating components related to the display unit of FIG. 2 according to one embodiment.

Referring to FIG. 3, the display unit DISL may include a display area DA that includes sub-pixels PX and a non-display area NDA that does not include the sub-pixels PX. In the display area DA, the sub-pixels PX, scan lines SL, and data lines DL may be disposed. The data lines DL may be arranged side by side along the first direction DR1, and the scan lines SL may be arranged side by side in the second direction DR2 intersecting the first direction DR1. The data lines DL may be connected to display pads PAD through signal lines FL1 in the non-display area NDA. The scan lines SL may be connected to a scan driver SDL in the non-display area NDA.

Each of the sub-pixels PX may be connected to at least one of the scan lines SL and one of the data lines DL. Each of the sub-pixels PX may include thin film transistors including a driving transistor and at least one switching transistor, a light emitting element, and a capacitor. Each of the sub-pixels PX may receive the data voltage of the data line DL when the scan signal is applied from the scan line SL, and may emit light by supplying a driving current to the light emitting element in response to the data voltage applied to the gate electrode of the driving transistor.

The non-display area NDA may be an area other than the display area DA in the display unit DISL. In the non-display area NDA, the scan driver SDL for applying scan signals to the scan lines SL, scan control lines SCL, signal lines FL1 connecting the data lines DL and the display pads PAD, and sensor pads TP1 and TP2 connected to sensing lines may be disposed.

The scan driver SDL may be connected to the display pads PAD through the plurality of scan control lines SCL, and thus may receive a scan control signal from the driver integrated circuit 510 disposed on the printed circuit board 500. The scan driver SDL generates scan signals according to the scan control signal and supplies the scan signals to the scan lines SL. The sub-pixels PX, to which data voltages are to be supplied, may be selected by the scan signals from the scan driver SDL, and the data voltages may be supplied to the selected sub-pixels PX. Although it is illustrated that the scan driver SDL is disposed on one outer side of the display area DA, for example, in the non-display area NDA on the left outer side, the disclosure is not limited thereto, and in some embodiments, the scan driver SDL may be disposed on opposite outer sides of the display area DA, for example, in the non-display area NDA on the left outer side and the right outer side.

The display panel 100 may include the display pads PAD connected to data lines DL and the scan control lines SCL, and the sensor pads TP1 and TP2 connected to the sensing lines. A display pad area PA where the display pads PAD are disposed may be disposed between a first sensor pad area TPA1 where first sensor pads TP1 are disposed and a second sensor pad area TPA2 where second sensor pads TP2 are disposed.

As shown in FIG. 3, in one embodiment, the display pad area PA may be disposed at the center of one edge of the display panel 100, the first sensor pad area TPA1 may be disposed on the left side of one edge of the display panel 100, and the second sensor pad area TPA2 may be disposed on the right side of one edge of the display panel 300. However, the disclosure is not limited thereto.

Figure 4:
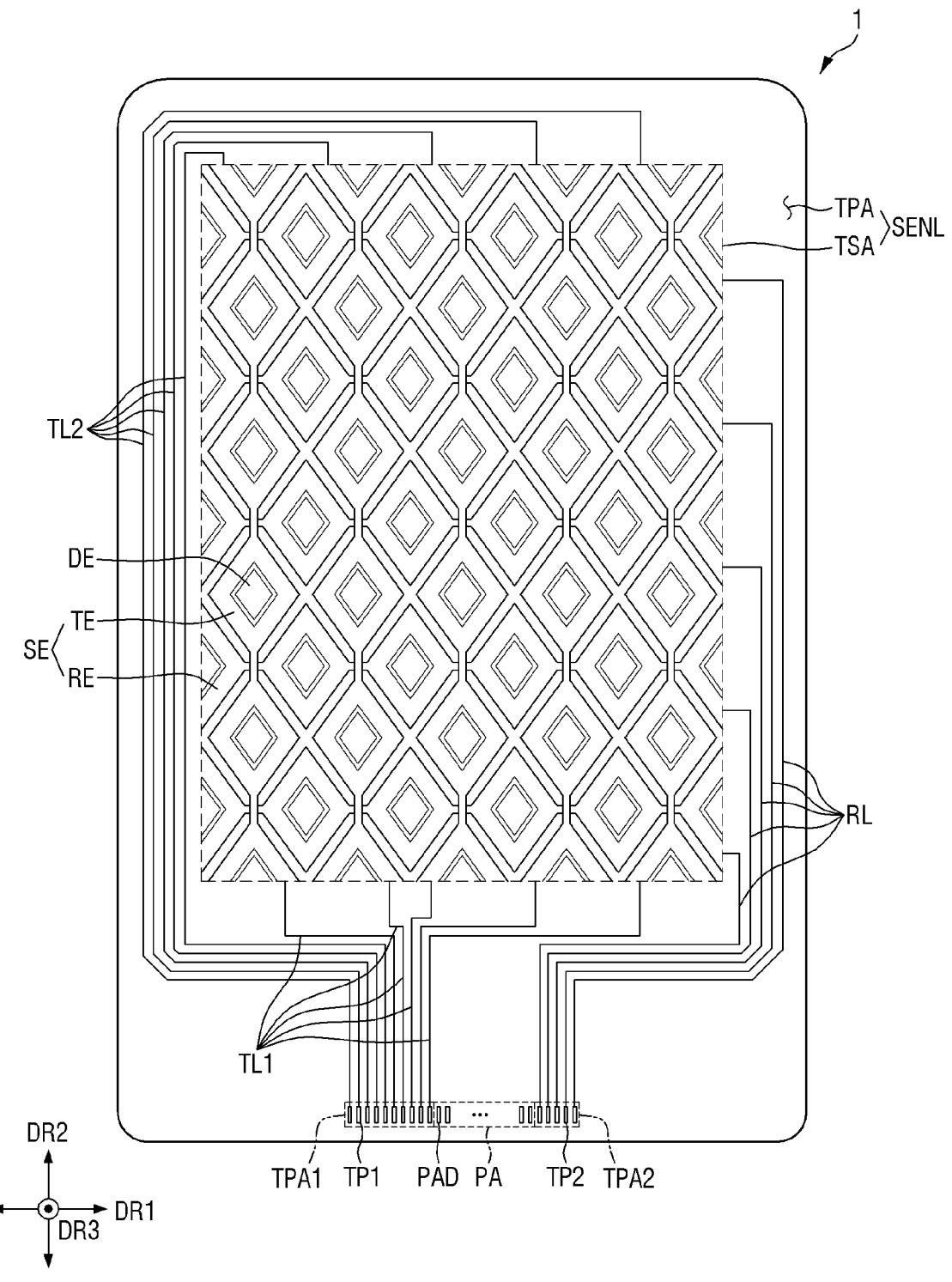
FIG. 4 is a plan view schematically illustrating an example of the sensing unit of FIG. 2 according to one embodiment.
Figure 5:
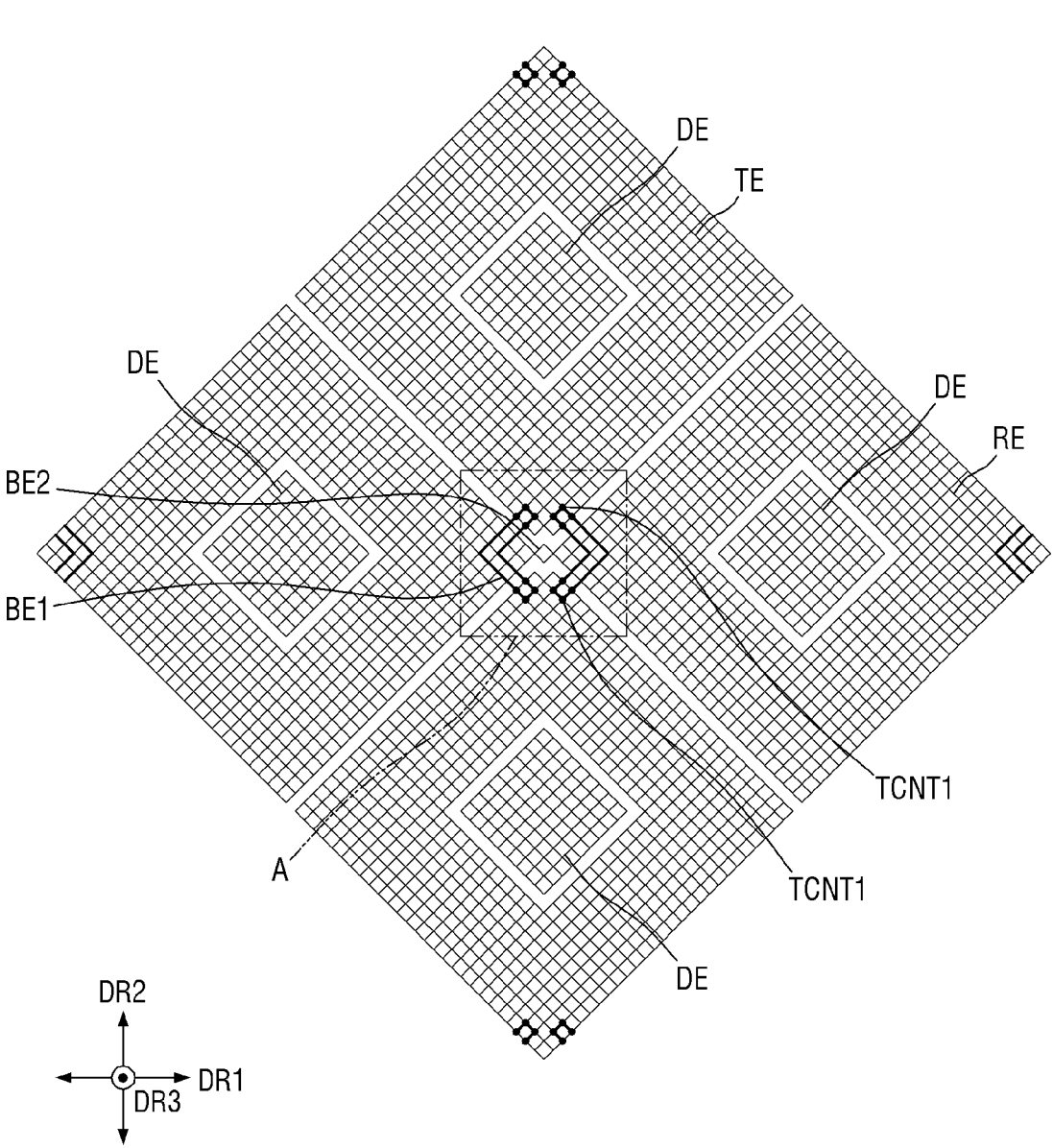
FIG. 5 is a plan view illustrating an example of driving electrodes, sensing electrodes, and dummy patterns of a first sensing area of FIG. 4 according to one embodiment.
Figure 6:
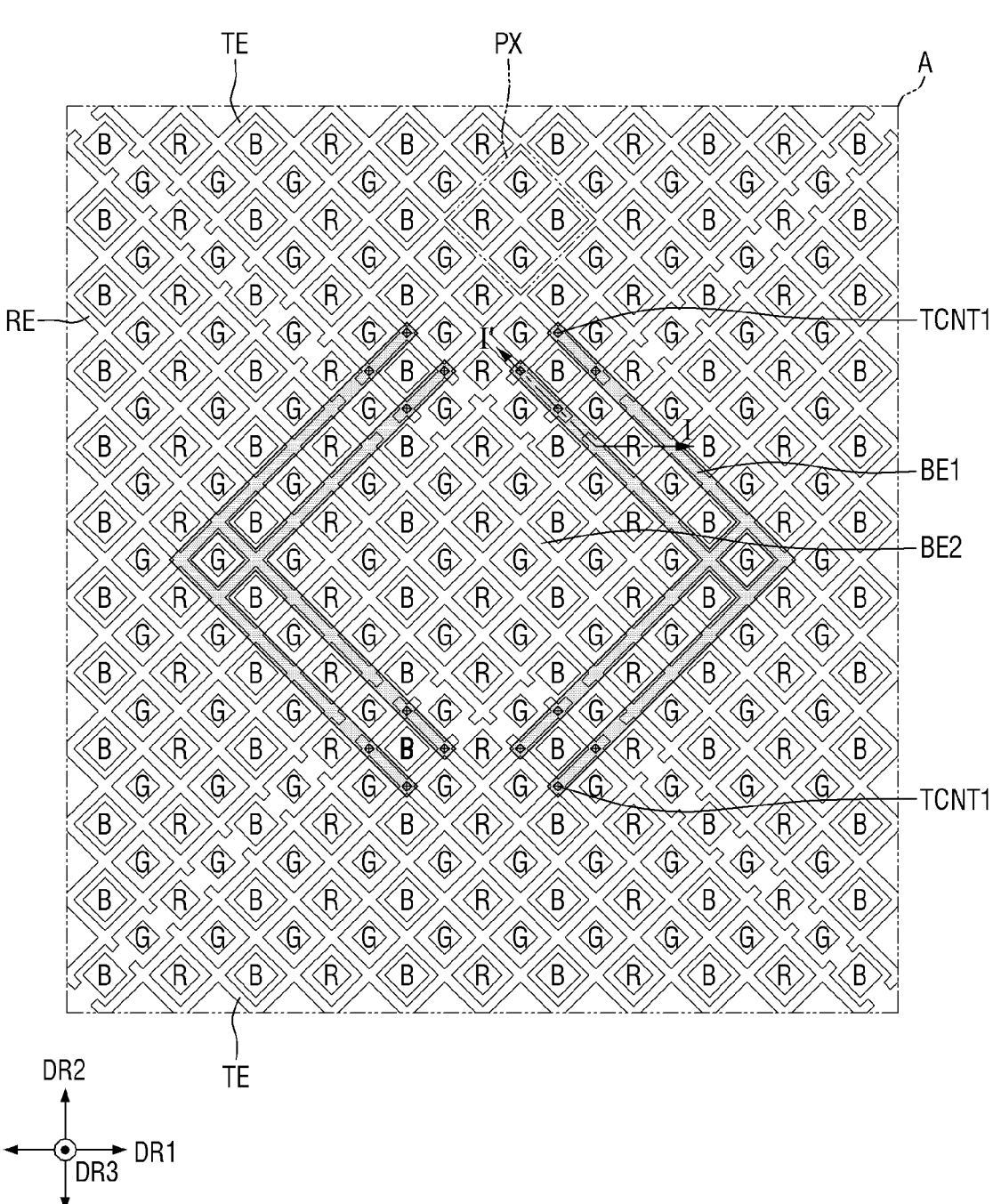
FIG. 6 is an enlarged view of area A of FIG. 5.

FIG. 4 is a plan view schematically illustrating an example of the sensing unit of FIG. 2 according to one embodiment. FIG. 5 is a plan view illustrating an example of driving electrodes, sensing electrodes, and dummy patterns of a first sensing area of FIG. 4 according to one embodiment. FIG. 6 is an enlarged view of area A of FIG. 5.

Although FIG. 4 mainly described the case where the sensor electrodes SE of the sensing unit SENL include two types of electrodes, e.g., driving electrodes TE and sensing electrodes RE, and are driven in a mutual capacitance manner in which a driving signal is applied to the driving electrodes TE and, then, the voltage charged in the mutual capacitance is sensed through the sensing electrodes RE, the disclosure is not limited thereto.

For simplicity of description, FIG. 4 illustrates only the driving electrodes TE, the sensing electrodes RE, dummy patterns DE, sensor lines TL1, TL2, and RL, and sensor pads TP1 and TP2.

Referring to FIG. 4, the sensing unit SENL includes the touch sensor area TSA for sensing user's touch and the touch peripheral area TPA disposed around the touch sensor area TSA. The touch sensor area TSA may overlap the display area DA of FIGS. 1 to 3, and the touch peripheral area TPA may overlap the non-display area NDA of FIGS. 1 to 3.

The touch sensor area TSA includes the driving electrodes TE, the sensing electrodes RE, and the dummy patterns DE. The driving electrodes TE and the sensing electrodes RE may be electrodes that generate the mutual capacitance to sense touch of an object or a person.

The sensing electrodes RE may be arranged side by side in the first direction DR1 and the second direction DR2. The sensing electrodes RE may be electrically connected in the first direction DR1. The sensing electrodes RE adjacent in the first direction DR1 may be connected to each other. The sensing electrodes RE adjacent in the second direction DR2 may be electrically separated from each other.

The driving electrodes TE may be arranged side by side in the first direction DR1 and the second direction DR2. The driving electrode TE adjacent in the first direction DR1 may be electrically separated from each other. The driving electrodes TE may be electrically connected in the second direction DR2. For example, the driving electrodes TE adjacent in the second direction DR2 may be connected to each other through a connection electrode BE1 as shown in FIG. 5.

Each of the dummy patterns DE may be surrounded by the driving electrode TE or the sensing electrode RE. Each of the dummy patterns DE may be electrically separated from the driving electrode TE or the sensing electrode RE. Each of the dummy patterns DE may be spaced apart from the driving electrode TE or the sensing electrode RE. Each of the dummy patterns DE may be electrically floating.

Although FIG. 4 illustrates that each of the driving electrodes TE, the sensing electrodes RE, and the dummy patterns DE has a rhombus planar shape, the disclosure is not limited thereto. For example, in some embodiments, each of the driving electrodes TE, the sensing electrodes RE, and the dummy patterns DE may have a quadrilateral shape other than a rhombus shape, a polygonal shape other than a quadrilateral shape, a circular shape, or an elliptical shape in a plan view.

The sensor lines TL1, TL2, and RL may be arranged in the sensor peripheral area TPA. The sensor lines TL1, TL2, and RL include sensing lines RL connected to the sensing electrodes RE, and first driving lines TL1 and second driving lines TL2 connected to the driving electrodes TE.

The sensing electrodes RE arranged at one side of the touch sensor area TSA may be connected one-to-one to the sensing lines RL. For example, as shown in FIG. 4, the sensing electrode RE disposed at a right end among the sensing electrodes RE electrically connected in the first direction DR1 may be connected to the sensing line RL. The sensing lines Rl, may be connected one-to-one to the second sensor pads TP2. Therefore, the sensing driver 610 (see FIG. 2) may be electrically connected to the sensing electrodes RE.

The driving electrodes TE arranged at one side of the touch sensor area TSA may be connected one-to-one to the first driving lines TL1, and the driving electrodes TE arranged at the other side of the touch sensor area TSA may be connected one-to-one to the second driving lines TL2. For example, as shown in FIG. 4, the driving electrode TE disposed at a lower end among the driving electrodes TE electrically connected in the second direction DR2 may be connected to the first driving line TL1, and the driving electrode TE disposed at an upper end may be connected to the second driving line TL2. The second driving lines TL2 may be connected to the driving electrodes TE on the upper side of the touch sensor area TSA via the left outer side of the touch sensor area TSA.

The first driving lines TL1 and the second driving lines TL2 may be connected one-to-one to the first sensor pads TP1. Therefore, the sensing driver 610 (see FIG. 2) may be electrically connected to the driving electrodes TE. Since the driving electrodes TE are connected to the driving lines TL1 and TL2 at opposite sides of the touch sensor area TSA and receive the touch driving signals, it is possible to prevent the difference between the touch driving signal applied to the driving electrodes TE arranged on the lower side of the touch sensor area TSA and the touch driving signal applied to the driving electrodes TE arranged on the upper side of the touch sensor area TSA due to the RC delay of the touch driving signal.

A first sensor pad area TPA1 where the first sensor pads TP1 are arranged may be disposed at one side of the display pad area PA where the display pads PAD are arranged. A second sensor pad area TPA2 where the second sensor pads TP2 are arranged may be disposed at the other side of the display pad area PA. The display pads PAD may be electrically connected to the data lines DL of the display panel 100.

Further, the first sensor pads TP1 and the second sensor pads TP2 may be electrically connected to the sensing driver 610 through the main circuit board 600 electrically connected to the printed circuit board 500.

For simplicity of description, FIG. 5 illustrates only two sensing electrodes RE adjacent in the first direction DR1 and two driving electrodes TE adjacent in the second direction DR2 in the first sensing area TSA1.

Referring to FIG. 5, each of the driving electrodes TE, the sensing electrodes RE, and the dummy patterns DE may have a quadrilateral planar shape, but the disclosure is not limited thereto. Further, the driving electrodes TE, the sensing electrodes RE, the dummy patterns DE, the first connection electrodes BE1, and a second connection electrode BE2 may be formed in a mesh structure or a net structure in a plan view. The size of the mesh (or net hole) of each of the driving electrodes TE, the sensing electrodes RE, the dummy patterns DE, the first connection electrodes BE1, and the second connection electrode BE2 may be substantially the same.

The sensing electrodes RE may be disposed in the first direction DR1 and electrically connected. The driving electrodes TE may be disposed in the second direction DR2 and electrically connected. Each of the dummy patterns DE may be disposed to be surrounded by the driving electrode TE or the sensing electrode RE. The driving electrodes TE, the sensing electrodes RE, and the dummy patterns DE may be electrically isolated from each other. The driving electrodes TE, the sensing electrodes RE, and the dummy patterns DE may be disposed apart from each other.

In order to electrically isolate the sensing electrodes RE and the driving electrodes TE at intersections therebetween, the driving electrodes TE adjacent to each other in the second direction DR2 may be connected through the first connection electrodes BE1, and the sensing electrodes RE adjacent to each other in the first direction DR1 may be connected through the second connection electrode BE2. The first connection electrode BE1 may be disposed on a different layer from the driving electrodes TE, and may be connected to the driving electrodes TE through first contact holes TCNT1. For example, the first connection electrode BE1 may be disposed on a second buffer layer BF2 shown in FIG. 7 to be described later, and the driving electrodes TE may be disposed on the first sensor insulating layer TINS1 shown in FIG. 7.

The first connection electrodes BE1 may be formed in such a way of being bent at least once. Although it is shown in FIG. 5 that the first connection electrodes BE1 are bent to have a bracket shape ("<" or ">"), the first connection electrodes BE1 are not limited in shape thereto.

Because the driving electrodes TE adjacent in the second direction DR2 are connected via the plurality of first connection electrodes BE1, even though one of the first connection electrodes BE1 is broken, the driving electrodes TE adjacent in the second direction DR2 may be stably connected. Although FIG. 7 to be described later illustrates that the driving electrodes TE adjacent to each other are connected by two first connection electrodes BE1, the number of the first connection electrodes BE1 is not limited thereto. The second connection electrode BE2 may be disposed on the same layer as the sensing electrodes RE, and may extend from the sensing electrodes RE. The sensing electrodes RE and the second connection electrode BE2 may be made of the same material. For example, the sensing electrodes RE and the second connection electrode BE2 may be disposed on the first sensor insulating layer TINS1 shown in FIG. 7 to be described later.

Figure 7:
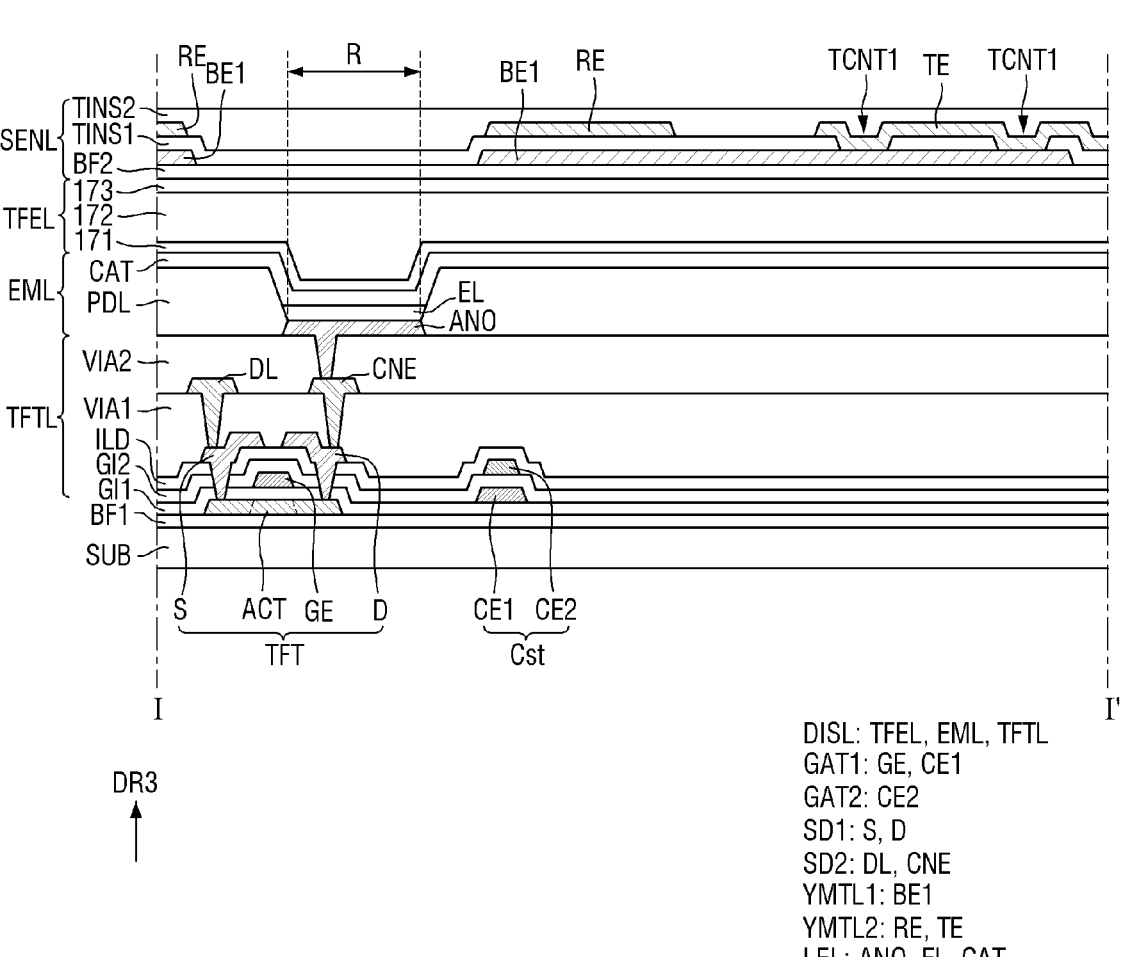
FIG. 7 is a cross-sectional view taken along line I-I' of FIG. 6.

As shown in FIG. 5, the first connection electrodes BE1 connecting the driving electrodes TE adjacent to each other in the second direction DR2 may be disposed on the second buffer layer BF2 (see FIG. 7), and the driving electrodes TE, the sensing electrodes RE, the dummy patterns DE, and the second connection electrode BE2 may be disposed on the first sensor insulating layer TINS1 (see FIG. 7). Therefore, the driving electrodes TE and the sensing electrodes RE may be electrically isolated at intersections therebetween, the sensing electrodes RE may be electrically connected in the first direction DR1, and the driving electrodes TE may be electrically connected in the second direction DR2.

Referring to FIG. 6, the driving electrodes TE, the sensing electrodes RE, the first connection electrodes BE1, and the second connection electrode BE2 may be formed in a mesh structure or a net structure in a plan view. The dummy patterns DE may also be formed in a mesh structure or a net structure in a plan view.

Since the driving electrodes TE, the sensing electrodes RE, the dummy patterns DE, and the second connection electrode BE2 are disposed on the same layer, they may be spaced apart from each other. A gap or an opening may be formed between the driving electrode TE and the sensing electrode RE, between the driving electrode TE and the second connection electrode BE2, between the driving electrode TE and the dummy pattern DE, and between the sensing electrode RE and the dummy pattern DE.

The first connection electrode BE1 may be connected to the driving electrodes TE through the first contact holes TCNT1. One end of the first connection electrode BE1 may be connected to one of the driving electrodes TE adjacent in the second direction DR2 via the first contact holes TCNT1. The other end of the first connection electrode BE1 may be connected to another one of the driving electrodes TE adjacent in the second direction DR2 via the first contact holes TCNT1. The first connection electrode BE1 may overlap the driving electrodes TE and the sensing electrode RE. Alternatively, the first connection electrode BE1 may overlap the second connection electrode BE2 instead of the sensing electrode RE. Alternatively, the first connection electrode BE1 may overlap opposite the sensing electrode RE and the second connection electrode BE2. Since the first connection electrode BE1 is disposed on a different layer from the driving electrodes TE, the sensing electrodes RE, and the second connection electrode BE2, it may not be short-circuited to the sensing electrode RE and/or the second connection electrode BE2 even if the first connection electrode BE1 overlaps the sensing electrode RE and/or the second connection electrode BE2.

The second connection electrode BE2 may be disposed between the sensing electrodes RE. The second connection electrode BE2 may be disposed on the same layer as the sensing electrodes RE, and may extend from each of the sensing electrodes RE. Therefore, the second connection electrode BE2 may be connected to the sensing electrodes RE without a separate contact hole.

Emission areas R, G, and B of sub-pixels may include a first emission area R emitting a first color, a second emission area G emitting a second color, and a third emission area B emitting a third color. The first color may be red, the second color may be green, and the third color may be blue. Although FIG. 6 illustrates that the first emission area R is the emission area of a first sub-pixel, the second emission area G is the emission area of a second sub-pixel, and the third emission area B is the emission area of a third sub-pixel, the disclosure is not limited thereto.

Although FIG. 6 illustrates that the first emission area R, the second emission area G, and the third emission area B have a quadrilateral planar shape, the disclosure is not limited thereto. For example, in some embodiments, the first emission area R, the second emission area G, and the third emission area B may have a polygonal shape other than a quadrilateral shape, a circular shape, or an elliptical shape in a plan view. Further, FIG. 6 illustrates that the size of the third emission area B is largest and the size of the second emission area G is smallest, but the disclosure is not limited thereto.

The sub-pixel PX refers to a group of sub-pixels capable of expressing gradation. Although FIG. 6 illustrates that the sub-pixel PX includes one first emission area R, two second emission areas G, and one third emission area B, and the first to third emission areas R, G, and B are disposed in a diamond or rhombus shape in a plan view, the disclosure is not limited thereto. For example, in some embodiments, the sub-pixel PX may include one first emission area R, one second emission area G, and one third emission area B, and the first to third emission areas R, G, and B may be arranged in a stripe shape in the first direction DR1.

Alternatively, the sub-pixel PX may include one first emission area R, one second emission area G, and one third emission area B, the third emission area B may be disposed to be longer in the second direction DR2 than in the first direction DR1, and each of the first and second emission areas R and G may be disposed to be longer in the first direction DR1 than in the second direction DR2. The first and second emission areas R and G may be disposed on one side of the third emission area B in the first direction DR1.

Since the driving electrodes TE, the sensing electrodes RE, the dummy patterns DE, the first connection electrodes BE1, and the second connection electrode BE2 are formed in a mesh structure or a net structure in a plan view, the emission areas R, G, and B may not overlap the driving electrodes TE, the sensing electrodes RE, the dummy patterns DE, the first connection electrodes BE1, and the second connection electrode BE2. Accordingly, lights emitted from the emission areas R, G, and B are blocked by the driving electrodes TE, the sensing electrodes RE, the dummy patterns DE, the first connection electrodes BE1, and the second connection electrode BE2, so that it is possible to prevent a decrease in the luminance of light.

FIG. 7 is a cross-sectional view taken along line I-I' of FIG. 6.

Referring to FIG. 7, the display unit DISL may include the substrate SUB, a first buffer layer BF1 disposed on the substrate SUB, a thin film transistor layer TFTL, a light emitting element layer EML, and a thin film encapsulation layer TFEL. The thin film transistor layer TFTL may include thin film transistors TFT, a first gate insulating layer GI1, a first gate conductive layer GAT1, a second gate insulating layer GI2, a second gate conductive layer GAT2, an inter-layer-insulating layer ILD, a first metal conductive layer SD1, a second metal conductive layer SD2, a first via-insulating layer VIA1, and a second via-insulating layer VIA2.

The substrate SUB may serve to support various components disposed on the substrate SUB. In one embodiment, the substrate SUB may be a flexible substrate containing a flexible material such as polyimide ("PI") or the like. However, the disclosure is not limited thereto.

The first buffer layer BF1 may be disposed on the substrate SUB. The first buffer layer BF1 may be disposed on one surface of the substrate SUB to protect the thin film transistors TFT and a light emitting layer EL of the light emitting element layer EML from moisture permeating through the substrate SUB that is susceptible to moisture permeation. The first buffer layer BF1 may be formed of or include a plurality of inorganic layers that are alternately stacked. For example, the first buffer layer BF1 may be formed of or include multiple layers in which one or more inorganic layers of a silicon nitride layer, a silicon oxynitride layer, a silicon oxide layer, a titanium oxide layer and an aluminum oxide layer are alternately stacked. In some embodiments, the first buffer layer BF1 may be omitted.

The thin film transistor layer TFTL including the thin film transistors TFT may be disposed on the first buffer layer BF1. The thin film transistor TFT may include an active layer ACT, a gate electrode GE, a source electrode S, and a drain electrode D. Although FIG. 7 illustrates that the thin film transistor TFT is configured to be of a top gate type in which the gate electrode GE is positioned above the active layer ACT, the disclosure is not limited thereto. For example, in some embodiments, the thin film transistors TFT may be configured to be of a bottom gate type in which the gate electrode GE is positioned under the active layer ACT, or a double gate type in which the gate electrode GE is positioned above and under the active layer ACT.

Specifically, the active layer ACT may be disposed on the first buffer layer BF1. The active layer ACT may include polycrystalline silicon, monocrystalline silicon, low-temperature polycrystalline silicon, amorphous silicon, or an oxide semiconductor. For example, the oxide semiconductor may include a binary compound (ABx), a ternary compound (ABxCy), or a quaternary compound (ABxCyDz) including indium, zinc, gallium, tin, titanium, aluminum, hafnium (Hf), zirconium (Zr), magnesium (Mg) and the like. For example, the active layer ACT may include ITZO (an oxide including indium, tin and titanium) or IGZO (an oxide including indium, gallium and tin). Although not shown in FIG. 7, in some embodiments, a light blocking layer for blocking external light incident on the active layer ACT may be disposed between the first buffer layer BF1 and the active layer ACT.

The first gate insulating layer GI1 may be disposed on the active layer ACT. The first gate insulating layer GI1 may be formed of or include an inorganic layer, for example, a silicon nitride layer, a silicon oxynitride layer, a silicon oxide layer, a titanium oxide layer, or an aluminum oxide layer. Although FIG. 7 illustrates that the first gate insulating layer GI1 is disposed in another area in addition to the area overlapping the gate electrode GE, the disclosure is not limited thereto. For example, in some embodiments, the first gate insulating layer GI1 may be disposed only in the area overlapping the gate electrode GE.

The first gate conductive layer GAT1 may be disposed on the first gate insulating layer GI1. The first gate conductive layer GAT1 may include the gate electrode GE of the thin film transistor TFT, a first electrode CE1 of a storage capacitor Cst, and a scan line (not shown).

The first gate conductive layer GAT1 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second gate insulation layer GI2 may be disposed on the first gate conductive layer GAT1. The second gate insulating layer GI2 may insulate the first gate conductive layer GAT1 from the second gate conductive layer GAT2. The second gate insulating layer GI2 may be disposed on the first gate insulating layer GI1 on which the first gate conductive layer GAT1 is disposed to cover the first gate conductive layer GAT1. The second gate insulating layer GI2 may be disposed to have substantially the same thickness along the profile of the first gate conductive layer GAT1. In one embodiment, the second gate insulating layer GI2 may contain the same material as that of the first gate insulating layer GI1. However, the disclosure is not limited thereto.

The second gate conductive layer GAT2 may be disposed on the second gate insulating layer GI2. The second gate conductive layer GAT2 may be positioned directly on one surface of the second gate insulating layer GI2. That is, the second gate conductive layer GAT2 may be in direct contact with one surface of the second gate insulating layer GI2.

The second gate conductive layer GAT2 may include a second electrode CE2 of the storage capacitor Cst. For example, as shown in FIG. 7, the second electrode CE2 may form the storage capacitor Cst together with the first electrode CE1. The second electrode CE2 may overlap the first electrode CE1 in the third direction DR3.

The interlayer-insulating layer ILD may insulate the second gate conductive layer GAT2 from the first metal conductive layer SD1 to be described later. The interlayer-insulating layer ILD may be disposed on the second gate insulating layer GI2 on which the second gate conductive layer GAT2 is disposed. The interlayer-insulating layer ILD may be formed of or include an inorganic layer, for example, a silicon nitride layer, a silicon oxynitride layer, a silicon oxide layer, a titanium oxide layer, or an aluminum oxide layer.

The first metal conductive layer SD1 may be disposed on the interlayer-insulating layer ILD. The first metal conductive layer SD1 may include a source electrode S and a drain electrode D of the thin film transistor TFT.

Each of the source electrode S and the drain electrode D may be connected to the active layer ACT through a contact hole penetrating the first gate insulating layer G1, the second gate insulating layer GI2, and the interlayer-insulating layer ILD. The source electrode S and the drain electrode D may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, the disclosure is not limited thereto, and in some embodiments, the first metal conductive layer SD1 may have a multilayer structure. For example, the first metal conductive layer SD1 may have a two-layer structure of Ti/Al or a three-layer structure of Ti/Al/Ti.

The first via-insulating layer VIA1 may serve to partially insulate the first metal conductive layer SD1 from the second metal conductive layer SD2 to be described later, and flatten a stepped portion formed by the element of the thin film transistor TFT. The first via-insulating layer VIA1 may be disposed on the interlayer-insulating layer ILD on which the first metal conductive layer SD1 is disposed. The first via-insulating layer VIA1 may be made of an organic insulating material such as an acrylic resin, a polyimide-based resin, a polyamide-based resin, or the like. For example, the first via-insulating layer VIA1 may be formed of or include an organic layer such as acryl resin, epoxy resin, phenolic resin, polyamide resin, polyimide resin and the like.

Figure 8:
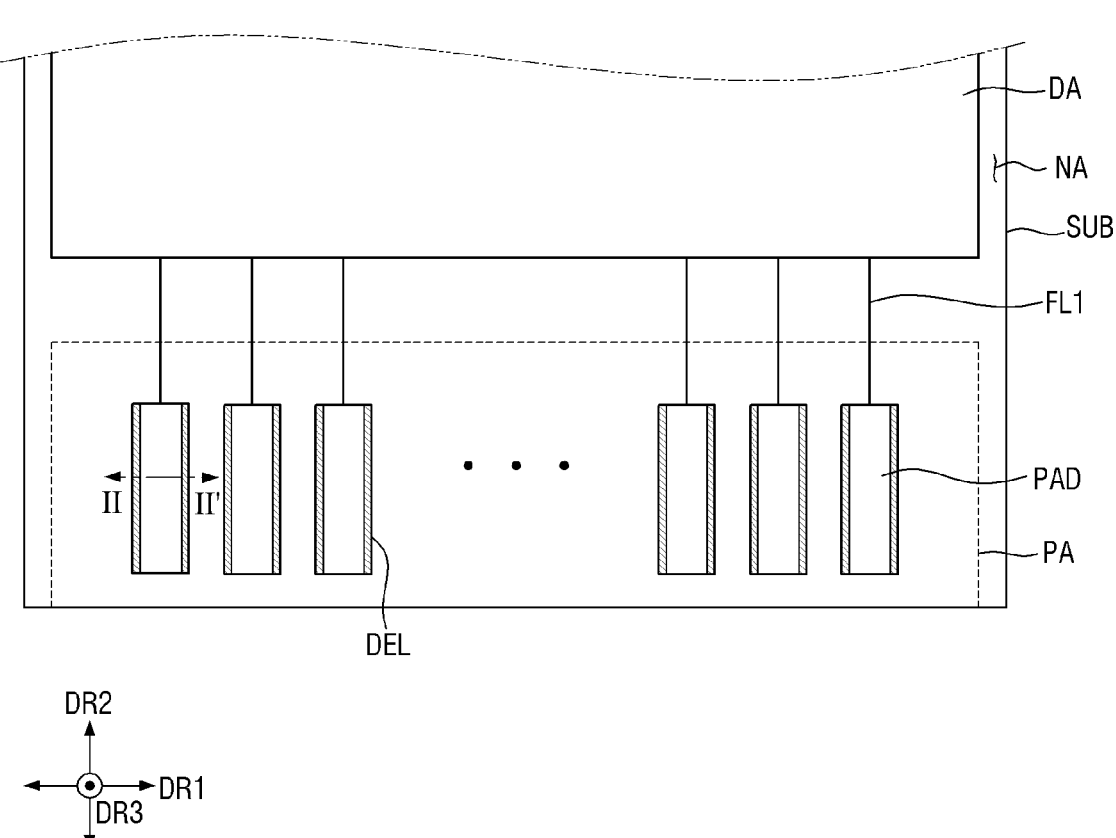
FIG. 8 is an enlarged plan view of a portion of a display panel according to one embodiment.

The second metal conductive layer SD2 may be disposed on the first via-insulating layer VIAL The second metal conductive layer SD2 may include a connection electrode CNE electrically connected to the source electrode S or the drain electrode D of the thin film transistor TFT, the data line DL, and an initialization voltage line (not shown). For example, as shown in FIG. 8, the second metal conductive layer SD2 may include the connection electrode CNE electrically connected to the drain electrode D. The connection electrode CNE may be electrically connected to the drain electrode D through a contact hole penetrating the first via-insulating layer VIAL The second metal conductive layer SD2 may include a metal. For example, the second metal conductive layer SD2 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). In some embodiments, the second metal conductive layer SD2 may have a multilayer structure. For example, the second metal conductive layer SD2 may have a two-layer structure of Ti/Al or a three-layer structure of Ti/Al/Ti.

The second via-insulating layer VIA2 may be disposed on the first via-insulating layer VIA1 on which the second metal conductive layer SD2 is disposed. The second via-insulating layer VIA2 may be made of an organic insulating material such as an acrylic resin, a polyimide-based resin, a polyamide-based resin, or the like. One surface of the second via-insulating layer VIA2 in the third direction DR3 may be the top surface on which the pixel defining layer PDL is disposed, and the other surface of the second via-insulating layer VIA2 in the third direction DR3 may be the bottom surface on which the first via-insulating layer VIA1 is disposed.

The light emitting element layer EML is formed on the thin film transistor layer TFTL. The light emitting element layer EML includes light emitting elements LEL and a pixel defining layer PDL.

Each of the light emitting elements LEL may include an anode electrode ANO, the light emitting layer EL, and a cathode electrode CAT, and the light emitting elements LEL and the pixel defining layer PDL are formed on the second via-insulating layer VIA2.

As shown in FIG. 7, the anode electrode ANO of the light emitting element LEL may be electrically connected to the connection electrode CNE through a contact hole penetrating the second via-insulating layer VIA2 and then electrically connected to the drain electrode D of the thin film transistor TFT.

In a top emission structure in which light is emitted toward the cathode electrode CAT when viewed with respect to the light emitting layer EL, the anode electrode ANO may be formed of or include a metal material, having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like. The APC alloy may be an alloy of silver (Ag), palladium (Pd) and copper (Cu). Alternatively, the anode electrode ANO may be formed of or include a single layer of molybdenum (Mo), titanium (Ti), copper (Cu), or aluminum (Al).

In a bottom emission structure in which light is emitted toward the anode electrode ANO when viewed with respect to the light emitting layer EL, the anode electrode ANO may be formed of or include a transparent conductive material ("TCO") such as ITO or IZO capable of transmitting light, or a semi-transmissive conductive material such as magnesium (Mg), silver (Ag), or an alloy of magnesium (Mg) and silver (Ag).

The pixel defining layer PDL may be disposed to partition the anode electrode ANO on the second via-insulating layer VIA2 in order to serve as the pixel defining layer for defining the emission areas R, G, and B. The pixel defining layer PDL may be disposed to cover the edge of the anode electrode ANO. The pixel defining layer 180 may be formed of or include an organic layer such as acryl resin, epoxy resin, phenolic resin, polyamide resin, polyimide resin and the like.

Each of the emission areas R, G, and B represents an area in which the anode electrode ANO, the light emitting layer EL, and the cathode electrode CAT are sequentially stacked, and holes from the anode electrode ANO and electrons from the cathode electrode CAT are combined with each other in the light emitting layer EL to emit light. Although not shown in FIG. 7, the second emission area G and the third emission area B may be substantially the same as the first emission area R illustrated in FIG. 7.

The light emitting layer EL may be disposed on the anode electrode ANO and the pixel defining layer PDL. In one embodiment, the light emitting layer EL may include an organic material to emit light in a predetermined color. For example, the light emitting layer EL may include a hole transporting layer, an organic material layer, and an electron transporting layer. In this case, the light emitting layer EL of the first emission area R may emit red light, the light emitting layer EL of the second emission area G may emit green light, and the light emitting layer EL of the third emission area B may emit blue light. The cathode electrode CAT is formed on the light emitting layer EL. The cathode electrode CAT may be disposed to cover the light emitting layer EL. The cathode electrode CAT may be a common layer formed commonly for the pixels. Although not shown in FIG. 7, in some embodiments, a capping layer may be disposed on the cathode electrode CAT.

In the top emission structure, the cathode electrode CAT may be formed of or include a transparent conductive material (TCO) such as ITO or IZO capable of transmitting light or a semi-transmissive conductive material such as magnesium (Mg), silver (Ag), or an alloy of magnesium (Mg) and silver (Ag).

In the bottom emission structure, the cathode electrode CAT may be formed of or include a metal material, having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like. The APC alloy may be an alloy of silver (Ag), palladium (Pd) and copper (Cu). However, the disclosure is not limited thereto, and in some embodiments, the cathode electrode CAT may be formed of or include a single layer of molybdenum (Mo), titanium (Ti), copper (Cu), aluminum (Al), or ITO.

The thin film encapsulation layer TFEL may be disposed on the light emitting element layer EML. Specifically, the thin film encapsulation layer TFEL may be disposed on the cathode electrode CAT. The thin film encapsulation layer TFEL may include at least one inorganic layer to prevent oxygen or moisture from permeating into the light emitting layer EL and the cathode electrode CAT. In addition, the thin film encapsulation layer TFEL may include at least one organic layer to protect the light emitting element layer EML from foreign substances such as dust.

For example, the thin film encapsulation layer TFEL may include a first inorganic layer 171 disposed on the cathode electrode CAT, an organic layer 172 disposed on the first inorganic layer 171, and a second inorganic layer 173 disposed on the organic layer 172. The first inorganic layer 171 and the second inorganic layer 173 may be formed of or include a silicon nitride layer, a silicon oxynitride layer, a silicon oxide layer, a titanium oxide layer, or an aluminum oxide layer, but the disclosure is not limited thereto. The organic layer 172 may be made of acryl resin, epoxy resin, phenolic resin, polyamide resin, polyimide resin and the like, but is not limited thereto.

The sensing unit SENL is formed on the thin film encapsulation layer TFEL. The sensing unit SENL may include the driving electrodes TE, the sensing electrodes RE, proximity sensing electrodes PE, the dummy patterns DE, the first connection electrodes BE1, the second connection electrodes BE2, the first driving lines TL1, the second driving lines TL2, and the sensing lines RL shown in FIGS. 4 to 6. FIG. 7 illustrates only the driving electrode TE, the sensing electrode RE, and the first connection electrode BE1 of the sensing unit SENL.

The second buffer layer BF2 may be formed on the thin film encapsulation layer TFEL of the thin film encapsulation layer TFEL. The second buffer layer BF2 may be formed of or include multiple layers in which one or more inorganic layers of a silicon nitride layer, a silicon oxynitride layer, a silicon oxide layer, a titanium oxide layer and an aluminum oxide layer are alternately stacked.

A first sensing electrode YMTL1 may be disposed on the second buffer layer BF2. The first sensing electrode YMTL1 may include the first connection electrodes BE1. The first connection electrodes BE1 may have a stacked structure (Ti/Al/Ti) of aluminum (Al) and titanium (Ti), a stacked structure (ITO/Al/ITO) of Al and ITO, an APC alloy, and a stacked structure (ITO/APC/ITO) of an APC alloy and ITO, but the disclosure is not limited thereto. For example, in some embodiments, the first connection electrodes BE1 may be formed of or include a single layer of molybdenum (Mo), titanium (Ti), copper (Cu), aluminum (Al), or ITO.

The first sensing insulating layer TINS1 is formed on the second buffer layer BF2 on which the first connection electrodes BE1 are disposed. The first sensing insulating layer TINS1 may be formed of or include an inorganic layer, for example, a silicon nitride layer, a silicon oxynitride layer, a silicon oxide layer, a titanium oxide layer, or an aluminum oxide layer.

Alternatively, the first sensing insulating layer TINS1 may be formed of or include an organic layer such as acryl resin, epoxy resin, phenolic resin, polyamide resin, polyimide resin and the like.

A second sensing electrode YMTL2 may be disposed on the first sensing insulating layer TINS1. The second sensing electrode YMTL2 may include the driving electrodes TE and the sensing electrodes RE. Specifically, the driving electrodes TE and the sensing electrodes RE may be formed on the first sensing insulating layer TINS1.

The driving electrodes TE and the sensing electrodes RE may have a stacked structure (Ti/Al/Ti) of aluminum (Al) and titanium (Ti), a stacked structure (ITO/Al/ITO) of Al and ITO, an APC alloy, and a stacked structure (ITO/APC/ITO) of an APC alloy and ITO, but the disclosure is not limited thereto. For example, in some embodiments, the driving electrodes TE and the sensing electrodes RE may be formed of or include a single layer of molybdenum (Mo), titanium (Ti), copper (Cu), aluminum (Al), or ITO.

Meanwhile, in some embodiments, the driving electrodes TE and the sensing electrodes RE may be formed on the same layer as the sensing electrodes RE, the dummy patterns DE, the second connection electrodes BE2, the first driving lines TL1, and the second driving lines TL2 shown in FIGS. 4 and 5 and may include the same material.

The first contact holes TCNT1 exposing the first connection electrodes BE1 while penetrating the first sensing insulating layer TINS1 may be formed in the first sensing insulating layer TINS1. The driving electrodes TE may be connected to the first connection electrodes BE1 through the first contact holes TCNT1.

A second sensing insulating layer TINS2 may be disposed on the driving electrodes TE and the sensing electrodes RE. The second sensing insulating layer TINS2 may serve to flatten a stepped portion formed by the driving electrodes TE, the sensing electrodes RE, and the first connection electrodes BE1. The second sensing insulating layer TINS2 may be formed of or include an organic layer such as acryl resin, epoxy resin, phenolic resin, polyamide resin, polyimide resin and the like.

As shown in FIG. 7, the first connection electrodes BE1 connecting the driving electrodes TE adjacent to each other may be disposed on the second buffer layer BF2, and the driving electrodes TE and the sensing electrodes RE may be disposed on the first sensing insulating layer TINS1. Therefore, the driving electrodes TE and the sensing electrodes RE may be electrically isolated at intersections therebetween, and as shown in FIGS. 5 and 6, the sensing electrodes RE may be electrically connected in the first direction DR1 and the driving electrodes TE may be electrically connected in the second direction DR2.

Figure 9:
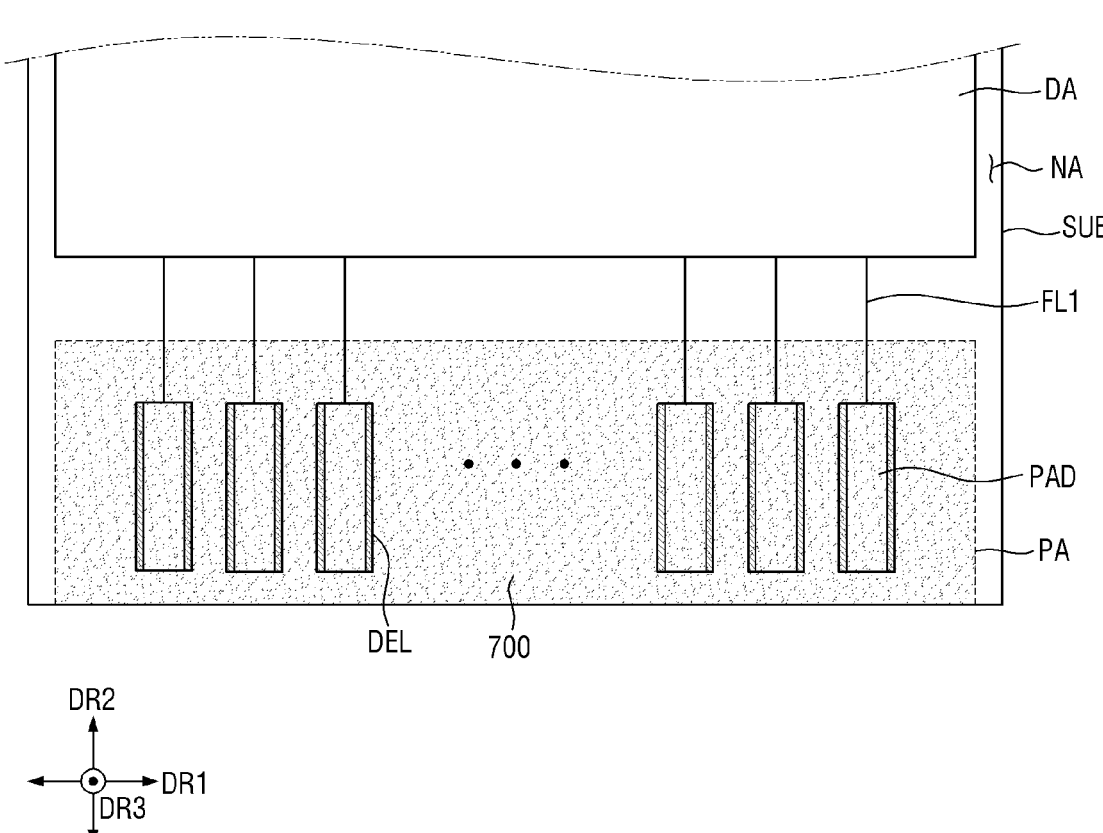
FIG. 9 is a plan view showing a state in which an anisotropic conductive film is attached to the panel pad area of FIG. 8.

FIG. 8 is an enlarged plan view of a portion of a display panel according to one embodiment. FIG. 9 is a plan view showing a state in which an anisotropic conductive film is attached to the panel pad area of FIG. 8.

Referring to FIG. 8, a plurality of display pads PAD may be disposed in the panel pad area PA. The display pads PAD may be arranged along the first direction DR1. Although FIG. 8 illustrates that the plurality of display pads PAD arranged along the first direction DR1 form one pad row, but the disclosure is not limited thereto. The plurality of display pads PAD may form a plurality of pad rows.

In the following description, a case where a plurality of display pads PAD form one pad row is described as an example. The signal line FL1 may serve to electrically connect the display pad PAD and the light emitting element of the display area DA. The display pad PAD may have a larger width in the first direction DR1 than the signal line FL1.

The display pad PAD may be connected to the display area DA through the signal line FL1. The display pad PAD may have a rectangular shape in a plan view.

Insulating members DEL may be disposed at opposite edges of the plurality of display pads PAD. Specifically, the display pad PAD may have a rectangular shape including two short sides in the first direction DR1 and two long sides in the second direction DR2 intersecting the first direction DR1 in a plan view, and the insulating members DEL may be disposed to cover opposite long sides of the display pad PAD extending in the second direction DR2.

That is, in a plan view, the insulating members DEL may be spaced apart from each other in the first direction DR1 with the top surface of the display pad PAD interposed therebetween to expose a part of the top surface of the display pad PAD and cover opposite edges of the display pad PAD extending in the second direction DR2. Further, the insulating members DEL may cover opposite side surfaces of the display pad PAD extending in the second direction DR2, and may be in contact with the substrate SUB.

However, the disclosure is not limited thereto, and in some embodiments, the width of the insulating member DEL in the first direction DR1 may be further increased and, thus, the area of the exposed top surface of the display pad PAD in a plan view may be reduced. Although FIG. 8 illustrates that the insulating member DEL has a rectangular shape having short sides extending in the first direction DR1 and long sides extending in the second direction DR2 in a plan view, similarly to the display pad PAD, the planar shape of the insulating member DEL is not limited thereto. Further, although FIG. 8 illustrates that the insulating member DEL covers opposite long sides of the display pad PAD extending in the second direction DR2 except the short sides of the display pad PAD extending in the first direction DR1, the disclosure is not limited thereto and, in some embodiments, the insulating member DEL may further cover opposite short sides of the display pad PAD extending in the first direction DR1. That is, the insulating member DEL may cover opposite short sides and long sides of the display pad PAD, all edges of the display pad PAD in a plan view, and the side surfaces of the display pad PAD extending in the first direction DR1 and the side surfaces of the display pad PAD extending in the second direction DR2, and may be in direct contact with the substrate SUB.

The insulating member DEL disposed on the display pad PAD will be described in detail later.

Figure 12:
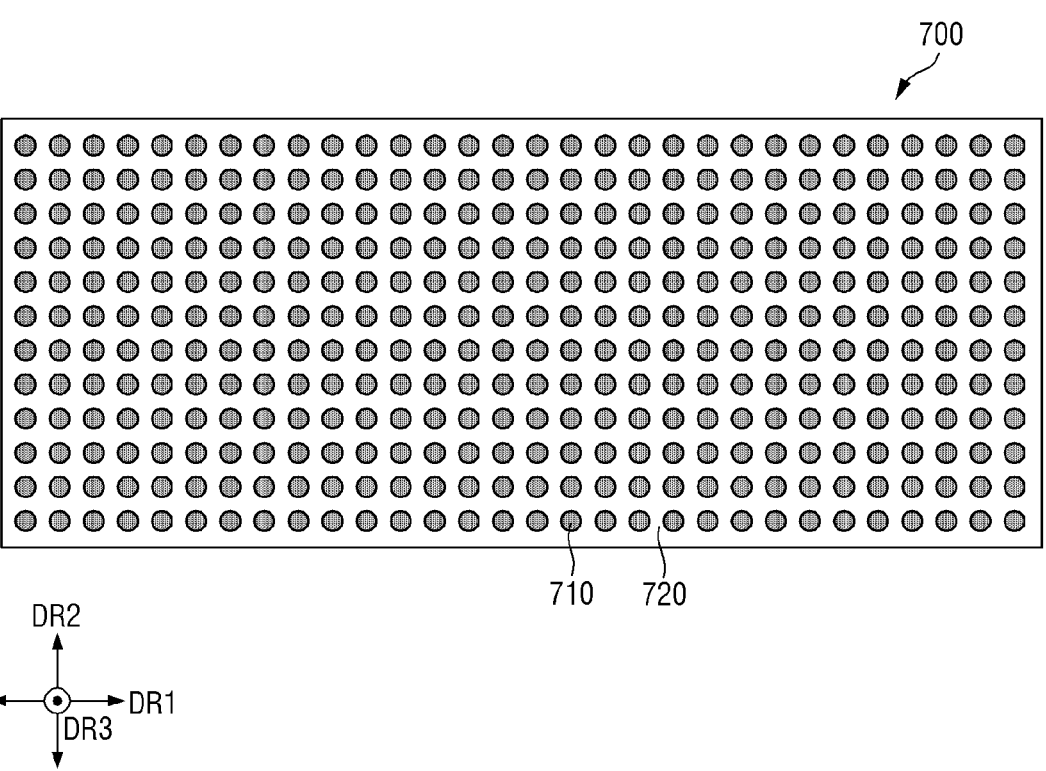
FIG. 12 is a plan view schematically showing an anisotropic conductive film according to one embodiment.

Referring to FIG. 9, an anisotropic conductive film 700 may be disposed on the plurality of display pads PAD. Referring to FIG. 12 to be described later, the anisotropic conductive film 700 may include an uncured bonding resin layer 720 and conductive balls 710 dispersed in the uncured bonding resin layer 720.

In a plan view, the anisotropic conductive film 700 may cover and overlap a pad row formed by the plurality of display pads PAD. The anisotropic conductive film 700 may be disposed to extend from one short sides of the plurality of display pads PAD adjacent to the display area DA and the other short sides opposite to the one short sides, and may be disposed to extend from the leftmost display pad PAD and the rightmost display pad PAD. The anisotropic conductive film 700 is not cured before the bonding of the display panel 100 and the printed circuit board 500, but may be cured by heat or UV after the printed circuit board 500 is disposed on the display panel 100.

The uncured bonding resin layer 720 included in the anisotropic conductive film 700 and the conductive balls 710 dispersed in the uncured bonding resin layer 720 will be described in detail later in conjunction with FIG. 12.

Figure 10:
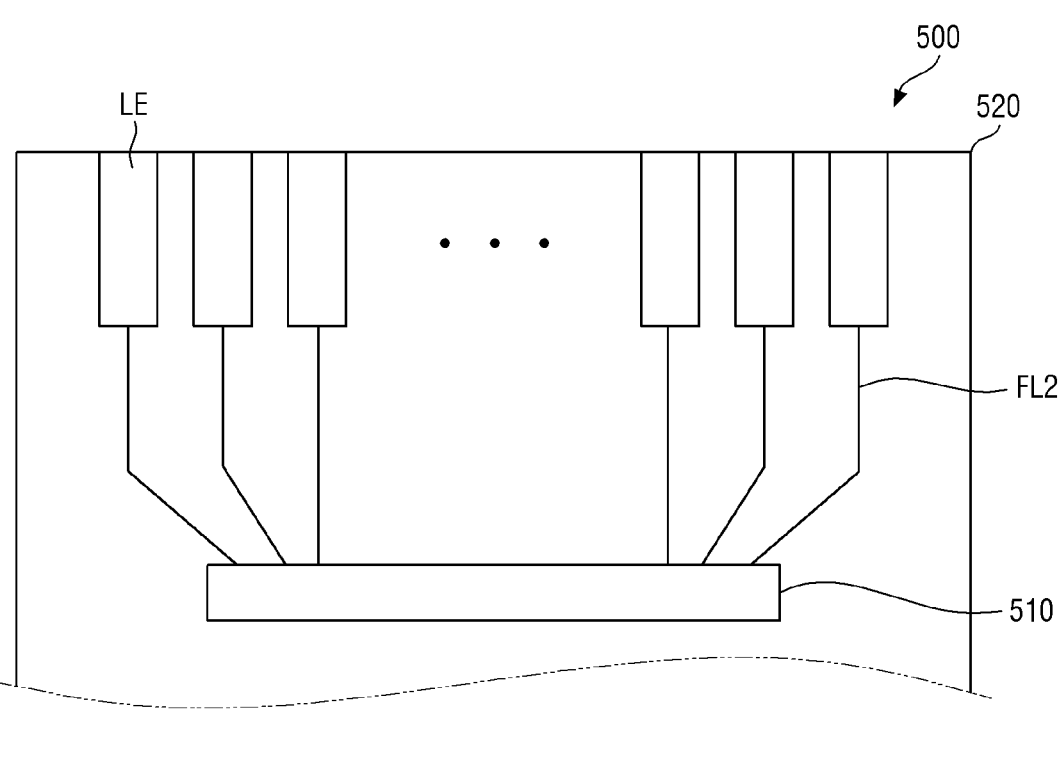
FIG. 10 is an enlarged plan view of a part of a printed circuit board according to one embodiment.
Figure 10:
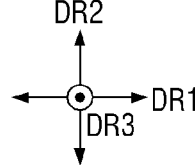

FIG. 10 is an enlarged plan view of a part of a printed circuit board according to one embodiment.

Referring to FIG. 10, the printed circuit board 500 may include a base film 520 and a lead electrode LE. The lead electrode LE may be electrically connected to the display pad PAD by the anisotropic conductive film 700 disposed on the display pad PAD.

The lead electrode LE may have a rectangular shape in a plan view. The planar shape of the lead electrode LE may be substantially the same as that of the display pad PAD. The lead electrode LE may be connected to the driver integrated circuit 510 through a lead connection line FL2. The lead connection line FL2 may be integrally formed with the lead electrode LE. The lead electrode LE may have a larger width in the first direction DR1 than the lead connection line SL2.

The lead electrode LE may include a metal material. For example, the lead electrode LE may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

Figure 11:
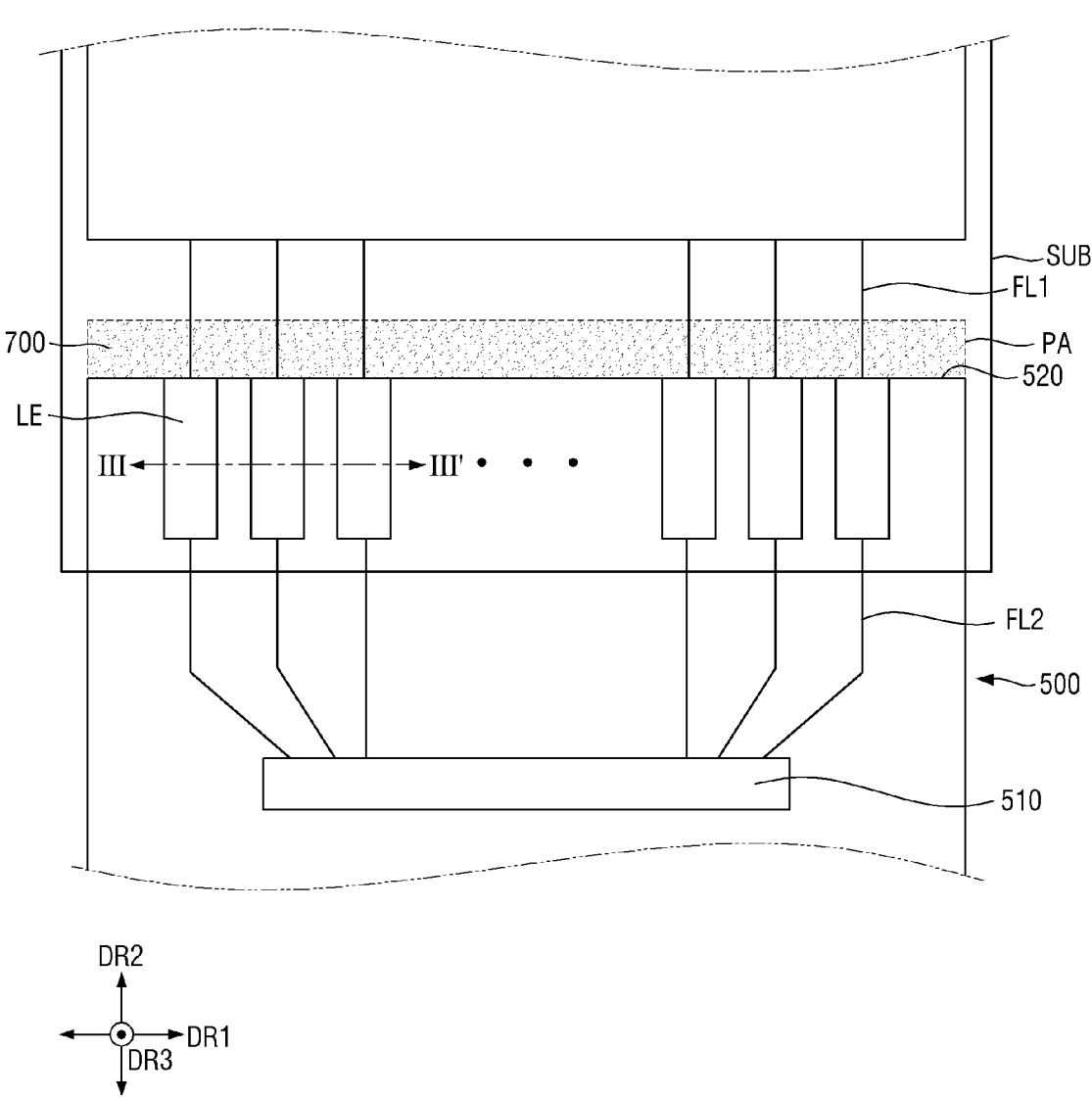
FIG. 11 is a plan view showing a state in which the printed circuit board of FIG. 10 is attached to the display panel of FIG. 9 according to one embodiment.

FIG. 11 is a plan view showing a state in which the printed circuit board of FIG. 10 is attached to the display panel of FIG. 9 according to one embodiment.

Referring to FIG. 11, in the third direction DR3, the plurality of display pads PAD included in the pad area PA may overlap the plurality of lead electrodes LE included in the printed circuit board 500 with the anisotropic conductive film 700 interposed therebetween.

Specifically, the anisotropic conductive film 700 may be disposed between the printed circuit board 500 and the pad area PA, and may electrically connect the display pads PAD of the pad area PA and the lead electrodes LE of the printed circuit board 500. Accordingly, the electrical signal transmitted from the printed circuit board 500 may be transmitted to the pad area PA through the anisotropic conductive film 700.

Specifically, as described above, the insulating members DEL may cover the long sides of the display pad PAD in the second direction DR2 and expose apart of the top surface of the display pad PAD, and the lead line 320 may be electrically connected to the top surface of the pad PAD exposed by the insulating member DEL through the anisotropic conductive film 700. That is, the lead electrode LE and the display pad PAD may be electrically connected by the conductive balls 710 (see FIG. 12) included in the anisotropic conductive film 700.

The electrical connection between the lead electrode LE and the display pad PAD will be described in detail later in conjunction with FIG. 13.

FIG. 12 is a plan view schematically showing an anisotropic conductive film according to one embodiment.

Referring to FIG. 12, the anisotropic conductive film 700 may include the plurality of conductive balls 710 and the uncured bonding resin layer 720. The uncured bonding resin layer 720 may cover the conductive balls 710. Each of the conductive balls 710 may have a circular planar shape.

In one embodiment, the conductive balls 710 may have a structure in which a spherical polymer is coated with a metal layer such as nickel, cobalt, gold, silver, or copper. In one embodiment, the conductive ball 710 may contain a core made of a polymer material and at least one metal layer surrounding the core. However, the disclosure is not limited thereto, and in some embodiments, the conductive balls 710 may be spherical particles made of a fusible material such as a solder material. For example, the fusible material may include zinc, gold, silver, lead, copper, tin, bismuth, indium, and the like.

In one embodiment, the uncured bonding resin layer 720 may be made of an insulating material. For example, the uncured bonding resin layer 720 may be made of thermoplastic resin such as styrene butadiene resin or polyvinyl butylene resin, or thermosetting resin such as epoxy resin, polyurethane resin, or acrylic resin. Alternatively, the uncured bonding resin layer 720 may be made of ultraviolet curable resin such as epoxy acrylate, urethane acrylate, unsaturated polyester resin, polyester acrylate, polyether acrylate or unsaturated acrylic resin.

Further, the uncured bonding resin layer 720 may have a viscosity of about 500 centipoises (cps) to 1000 cps at 25° C. before curing. For example, the viscosity of the uncured bonding resin layer 720 before curing may be about 600 cps. However, the disclosure is not limited thereto.

As shown in FIG. 12, the conductive balls 710 may be arranged in the first direction DR1 and the second direction DR2 in the uncured bonding resin layer 720, and may be regularly spaced apart from each other at the same interval. That is, the conductive balls 710 may be arranged in a lattice shape in only one layer, and may not overlap each other in the third direction DR3 perpendicular to the first direction DR1 and the second direction DR2.

In one embodiment, the thickness of the uncured bonding resin layer 720 in the third direction DR3 may be greater than the diameter of each of the conductive balls 710, or may be smaller than twice the diameter of the conductive balls 710. For example, when the thickness of the uncured bonding resin layer 720 in the third direction DR3 is small as the diameter of each of the conductive balls 710, the space between the surfaces of the conductive balls 710 included in the anisotropic conductive film 700 and the lead electrodes LE (see FIG. 13) and the display pads PAD (see FIG. 13) is minimized, so that the contact resistance obtained, when the surfaces of the plurality of conductive balls 710 are bonded and in contact with the lead electrodes LE and the display pads PAD, may be minimized.

Figure 13:
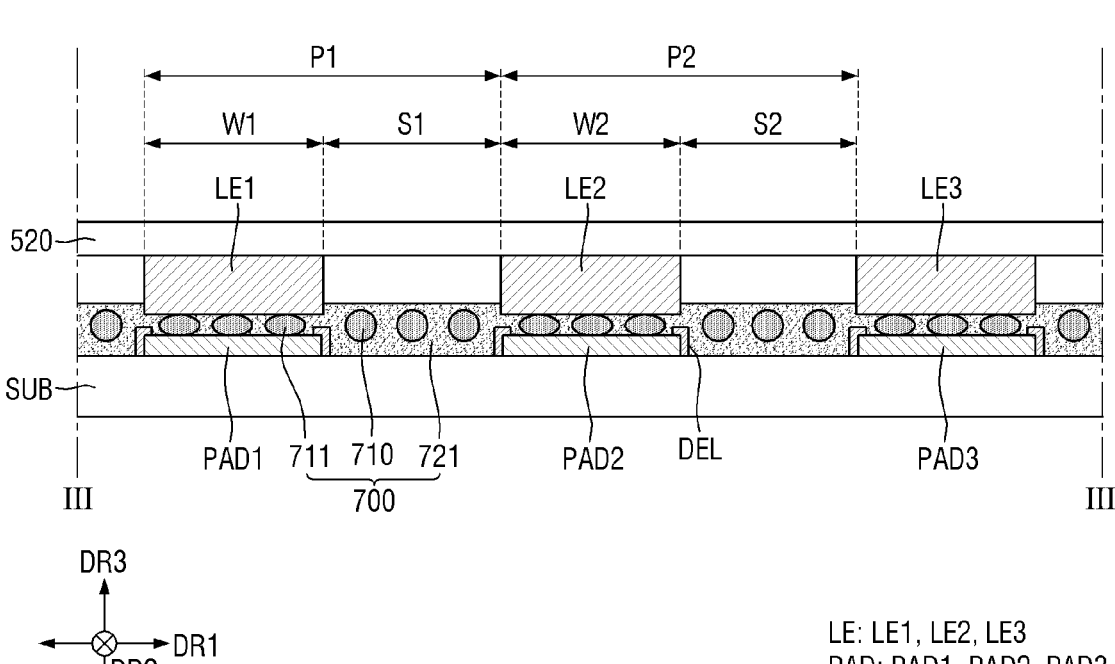
FIG. 13 is a cross-sectional view taken along line of FIG. 11 according to one embodiment.
Figure 14:
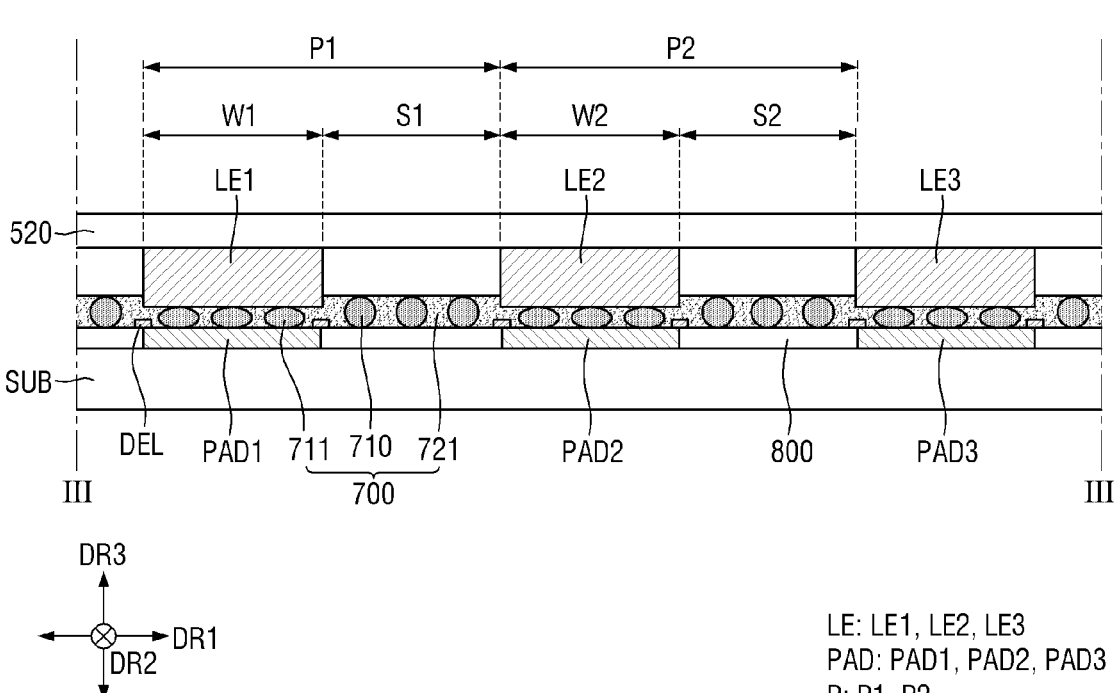
FIG. 14 is a cross-sectional view taken along line III-IIP of FIG. 11 according to another embodiment.

FIG. 13 is a cross-sectional view taken along line of FIG. 11 according to one embodiment. FIG. 14 is a cross-sectional view taken along line of FIG. 11 according to another embodiment.

Referring to FIG. 13, the plurality of display pads PAD may be disposed on one surface (e.g., top surface) of the substrate SUB facing the printed circuit board 500. The plurality of display pads PAD may be disposed to be spaced apart from each other at a pitch P in the first direction DR1 in a cross-sectional view.

Specifically, in a cross-sectional view, a first display pad PAD1 having a first width W1 in the first direction DR1 and a second display pad PAD2 having a second width W2 in the first direction DR1 may be disposed to be spaced apart from each other by a first gap 51 in the first direction DR1, and may be disposed to be spaced apart from each other at a first pitch P1 in the first direction DR1.

Further, in a cross-sectional view, the second display pad PAD2 having a second width W2 in the first direction DR1 and a third display pad PAD3 may be disposed to be spaced apart from each other by a second gap S2, and may be disposed to be spaced apart from each other at a second pitch P2 in the first direction DR1.

Referring to FIG. 13, the plurality of lead electrodes LE may be disposed on one surface (e.g., bottom surface) of the base film 520 of the printed circuit board 500 facing the display panel 100. The plurality of lead electrodes LE may be disposed to face the plurality of display pads PAD, respectively. That is, the plurality of lead electrodes LE may be disposed to overlap the plurality of display pads PAD in the thickness direction, respectively.

In one embodiment, the plurality of lead electrodes LE may be disposed to be spaced apart from each other at the first pitch P1 which is the same as the pitch of the plurality of display pads PAD.

Specifically, the first width W1 of the first lead electrode LE1 and the second width W2 of the second lead electrode LE2 in the first direction DR1 are the same as the width of the first display pad PAD1 and the width of the second display pad PAD2, respectively, the first gap 51 between the first lead electrode LE1 and the second lead electrode LE2 in the first direction DR1 is the same as the gap between the first display pad PAD1 and the second display pad PAD2 in the first direction DR1, and the second gap S2 between the second lead electrode LE2 and the third lead electrode LE3 in the first direction DR1 is the same as the gap between the second display device PAD2 and the third display device PAD3, so that the first lead electrode LE1 and the second lead electrode LE2 may be disposed to be spaced apart from each other at the first pitch P1 in the first direction DR1, and the second lead electrode LE2 and the third lead electrode LE3 may be disposed to be spaced apart from each other at the second pitch P2 in the first direction DR1.

As described above, the plurality of conductive balls 710 included in the anisotropic conductive film 700 are disposed in the area where the plurality of lead electrodes LE and the plurality of display pads PAD overlap each other in the thickness direction (i.e., the third direction DR3), so that the plurality of lead electrodes LE and the plurality of display pads PAD may be electrically connected.

As shown in FIG. 13, the anisotropic conductive film 700 may include a first area where the plurality of lead electrodes LE and the plurality of display pads PAD overlap each other in the thickness direction and a second area where the plurality of lead electrode LE and/or the plurality of display pads PAD do not overlap each other in the thickness direction, and a plurality of conductive balls 710 and 711 may be disposed to form one column in the first area and the second area.

The plurality of conductive balls 711 disposed in the first area may overlap and be in contact with the plurality of display pads PAD and the plurality of lead electrodes LE in the thickness direction. The plurality of conductive balls 710 included in the second area may not overlap the display pad PAD and the lead electrode LE in the thickness direction.

Referring to FIG. 13, the cross-sectional shape of the conductive balls 711 included in the first area and the cross-sectional shape of the conductive balls 710 included in the second area may be different from each other. Specifically, the conductive balls 711 included in the first area may be compressed between the lead electrode LE and the display pad PAD in a cross-sectional view to have an elliptical shape elongated in a left-right direction in a cross-sectional view. That is, the conductive balls 711 included in the first area may have an elliptical shape in which the diameter of the conductive balls 711 in the first direction DR1 is greater than the diameter of the conductive balls 711 in the third direction DR3 in a cross-sectional view.

Further, no vertical pressure is applied by the lead electrode LE and/or the display pad PAD to the second area during a bonding step performed by a thermocompression process, so that the conductive balls 710 included in the second area may maintain the original shape in the anisotropic conductive film 700 before compression.

Referring to FIG. 13, a bonding resin layer 721 included in the anisotropic conductive film 700 may be disposed between the base film 520 and the substrate SUB while surrounding the plurality of conductive balls 710 and 711. The bonding resin layer 721, which is cured by the thermocompression process, may be in a cured state, unlike the uncured bonding resin layer 720 shown in FIG. 12.

The bonding resin layer 721 may limit the fluidity of the conductive balls 710 and 711 while surrounding the conductive balls 711 positioned in the first area and the conductive balls 710 positioned in the second area, and the conductive balls 711 positioned in the first area and the conductive balls 710 positioned in the second area may be positioned substantially on the same line and form one column.

As shown in FIG. 13, the thickness in the third direction DR3 of a second portion of the bonding resin layer 721 positioned in the second area may be greater than the thickness in the third direction DR3 of a first portion of the bonding resin layer 721 positioned in the first area, because no vertical force is applied to the second portion of the bonding resin layer 721 by the lead electrode LE and/or the display pad PAD in the thermocompression process.

Accordingly, the top surface of the second portion the bonding resin layer 721 positioned in the second area may be positioned higher than one surface (e.g., bottom surface) of the lead electrode LE facing one surface (e.g., top surface) of the display pad PAD, and may be in contact with a part of the sidewall of the lead electrode LE.

As described above in conjunction with FIG. 8, the insulating members DEL may be disposed at the edges of the plurality of display pads PAD. Specifically, the insulating members DEL may be disposed on opposite sides of the display pad PAD while being spaced apart from each other in the first direction DR1 with the display pad PAD interposed therebetween, and may cover a part of the top surface of the display pad PAD and opposite side surfaces of the display pad PAD. That is, the corner portions and opposite side surfaces of the display pad PAD may be covered.

In other words, the insulating member DEL may cover opposite side surfaces of the display pad PAD while exposing the central portion of the top surface of the display pad PAD, and may be in direct contact with the substrate SUB while covering opposite side surfaces of the display pad PAD.

Although FIG. 13 illustrates that the insulating members DEL cover a part of the top surface and opposite side surfaces of the display pad PAD and are in contact with the substrate SUB, the disclosure is not limited thereto and, in some embodiments, the insulating members DEL may cover a part of the top surface and opposite side surfaces of the display pad PAD and further cover the top surface of the substrate SUB disposed between the display pads PAD spaced apart from each other in the first direction DR1. For another example, the insulating member DEL may cover a part of the top surface and opposite side surfaces of the display pad PAD and the entire top surface of the substrate SUB positioned between the display pads PAD spaced apart from each other in the first direction DR1, and may be connected to the insulating member DEL spaced apart therefrom in the first direction DR1 with the top surface of the substrate SUB interposed therebetween. That is, the insulating members DEL may be disposed to cover a part of the top surface and one side surface of each of the display pads PAD spaced apart from each other in the first direction DR1, and the top surface of the substrate SUB.

The width in the third direction DR3 between the area in which the insulating member DEL is disposed on the top surface of the display pad PAD and the lead electrode LE may be smaller than the width in the third direction DR3 between the area in which the insulating member DEL is not disposed on the top surface of the display pad PAD and the lead electrode LE.

In one embodiment, the insulating member DEL may contain an inorganic material or an organic material having a high insulating property. When the insulating member DEL contains an inorganic material, it may be formed of, for example, a silicon nitride layer, a silicon oxynitride layer, a silicon oxide layer, a titanium oxide layer, or an aluminum oxide layer.

Further, when the insulating member DEL contains an organic material, it may contain, for example, a mixture of acrylate and polycarbonate, PA66, PA11, PMMA Impact modified, a mixture of styrene and polycarbonate, or the like.

Since, however, the insulating member DEL has a higher dielectric strength when it is made of the above-described inorganic material than when it is made of the above-described organic material, the thickness of the insulating member DEL may be smaller when it is made of the above-described inorganic material than when it is made of the organic material. That is, when the insulating member DEL is made of the above-described inorganic material, the insulating member DEL may have a better insulation effect even if it has a smaller thickness compared to when the insulating member DEL is made of the above-described organic material.

Therefore, due to the insulating members DEL disposed at opposite corner portions and side surfaces of the display pad PAD, it is possible to prevent a short circuit problem that may be caused by misalignment of the plurality of lead electrodes LE and/or the plurality of display pads PAD in the first direction DR1 during bonding of the lead electrode LE and the display pad PAD in the third direction DR3. For example, even when the plurality of lead electrodes LE and/or the plurality of display pads PAD are misaligned in the first direction DR1, the insulating members DEL are disposed at opposite corner portions and side surfaces of the display pad PAD, so that it is possible to prevent a problem that the first lead electrode LE1 and the second display pad PAD2 are short-circuited by the conductive balls 710 included in the second area where the lead electrode LE and/or the plurality of display pads PAD do not overlap each other in the thickness direction (i.e., the third direction DR3).

Referring to FIG. 14, unlike the embodiment of FIG. 13, a filling member 800 is further disposed between the plurality of display pads PAD adjacent to each other, and the insulating members DEL are disposed on the display pad PAD and the filling member 800.

Specifically, the filling member 800 may be disposed to fill the space formed between the substrate SUB and the plurality of display pads PAD. That is, the filling member 800 may be disposed in the space between the display pads PAD spaced apart from each other in the first direction DR1, the top surface of the filling member 800 may be in direct contact with the bonding resin layer 721, and the bottom surface of the filling member 800 may be in direct contact with the substrate SUB.

Further, unlike the embodiment of FIG. 13, in the embodiment, the insulating member DEL may be disposed to extend in the first direction DR1 on the top surface of the display pad PAD and the top surface of the filling member 800.

That is, the edges of the top surface of the display pad PAD may be covered by the insulating members DEL, and opposite side surfaces of the display pad PAD may be covered by the filling members 800.

Accordingly, the stepped portion formed by the display pads PAD spaced apart from each other along the first direction DR1 may be compensated by the filling member 800 disposed between the display pads PAD, and the filling member 800 may serve to insulate the display pad PAD together with the insulating member DEL.

Although the embodiment of FIG. 14 illustrates that the width of the filling member 800 in the third direction DR3 is the same as the width of the display pad PAD in the third direction DR3, the disclosure is not limited thereto, and in some embodiments, the width of the filling member 800 in the third direction DR3 may be smaller than or greater than the width of the display pad PAD in the third direction DR3.

When the width of the filling member 800 in the third direction DR3 is smaller than the width of the display pad PAD in the third direction DR3, the insulating member DEL may be in contact with the filling member 800 while covering the top surface of the display pad PAD and the side surfaces of the display pad PAD. For another example, the insulating member DEL may be disposed to cover the top surface of the display pad PAD, the side surfaces of the display pad PAD, and the top surface of the filling member 800.

The filling member 800 may be made of an insulating material. The filling member 800 and the bonding resin layer 721 may be made of the same type of resin, or may be made of different types of resins. For example, the bonding resin layer 721 and the filling member 800 may be the same acrylic resin. For another example, the bonding resin layer 721 may be acrylic resin, and the filling member 800 may be epoxy resin. For still another example, opposite the bonding resin layer 721 and the filling member 800 may be thermosetting resin. For still another example, the bonding resin layer 721 may be thermosetting resin, and the filling member 800 may be ultraviolet curing resin. For still another example, each of the bonding resin layer 721 and the filling member 800 may contain at least one of the ultraviolet curing resin and the thermosetting resin.

Figure 15:
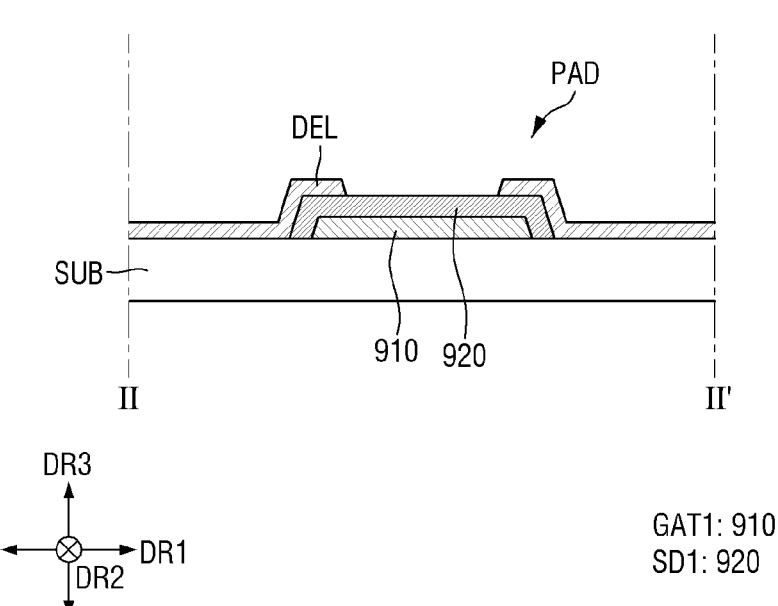
FIG. 15 is a cross-sectional view taken along II-IP of FIG. 8 according to one embodiment.

FIG. 15 is a cross-sectional view taken along II-IP of FIG. 8 according to one embodiment.

Referring to FIG. 15, the display pad PAD may include a first pad electrode 910, a second pad electrode 920, and the insulating members DEL.

The first pad electrode 910, the second pad electrode 920, and the insulating members DEL may be sequentially stacked on the substrate SUB along the third direction DR3. Specifically, the first pad electrode 910 may be directly disposed on one surface of the substrate SUB, and the second pad electrode 920 may be disposed on the first pad electrode 910 while being in contact with the first pad electrode 910. The first pad electrode 910 has a smaller size than the second pad electrode 920. That is, the second pad electrode 920 may extend outward from the side surfaces of the first pad electrode 910 and may completely cover the first pad electrode 910.

The insulating members DEL may be disposed on the second pad electrode 920 while exposing a part of the top surface of the second pad electrode 920 disposed on the uppermost layer. That is, the insulating members DEL may be symmetrically disposed while being spaced apart from each other in the first direction DR1 with the top surface of the second pad electrode 920 interposed therebetween, and may cover opposite edges of the top surface and opposite side surfaces of the second pad electrode 920. However, the disclosure is not limited thereto, and the insulating members DEL disposed on the top surface of the second pad electrode 920 may further extend toward the central portion of the top surface of the second pad electrode 920.

Further, the insulating members DEL disposed on opposite side surfaces of the second pad electrode 920 may extend in the first direction DR1 to be in direct contact with the top surface of the substrate SUB, and may cover the top surface of the substrate SUB.

The first pad electrode 910 may be a signal line that transmits a scan signal to the gate electrode GE (see FIG. 7). Further, the first pad electrode 910 and the gate electrode GE of the thin film transistor TFT and the first electrode CE1 of the storage capacitor Cst described in FIG. 8 may be formed by the same process and may include the same material. That is, the first pad electrode 910 may include the same material as those of the gate electrode GE of the thin film transistor TFT and the first electrode CE1 of the storage capacitor Cst. However, the disclosure is not limited thereto, and in some embodiments, the first pad electrode 910 and the second electrode CE2 of the storage capacitor Cst may be formed by the same process and may include the same material.

The second pad electrode 920 and the first metal conductive layer SD1 (see FIG. 7) may be formed by the same process and may include the same material. However, the disclosure is not limited thereto, and in some embodiments, the second pad electrode 920 and the second metal conductive layer SD2 (see FIG. 7) may be formed by the same process and may include the same material.

Hereinafter, other embodiments of the display device will be described. In the following embodiments, description of the same components as those of the above-described embodiment, which are denoted by like reference numerals, will be omitted or simplified, and differences will be mainly described.

Figure 16:
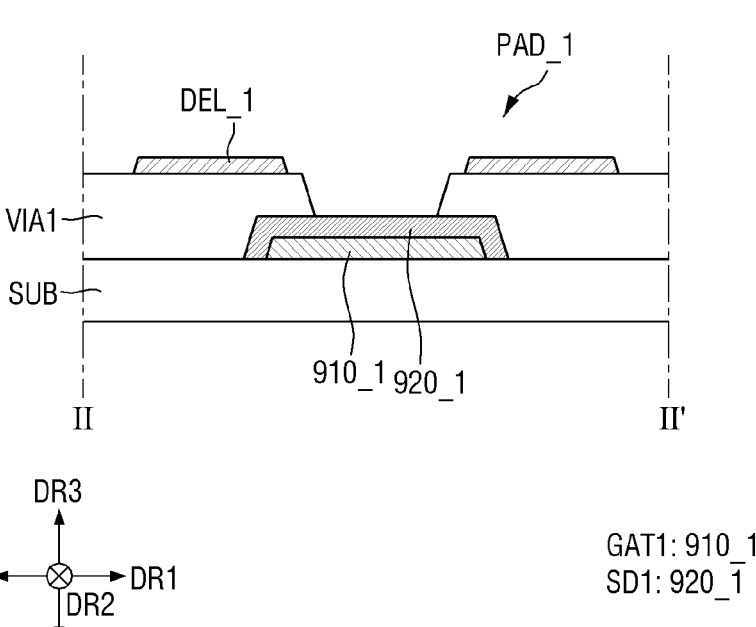
FIG. 16 is a cross-sectional view taken along II-IP of FIG. 8 according to another embodiment.

FIG. 16 is a cross-sectional view taken along II-IP of FIG. 8 according to another embodiment. FIGS. 17 to 22 are cross-sectional views taken along line II-IF of FIG. 8 according to other embodiments.

Referring to FIG. 16, unlike the embodiment of FIG. 15, a via-insulating layer VIA1 is further disposed between a second pad electrode 920_1 and an insulating member DEL_1.

Specifically, the first via-insulating layer VIA1 may include an opening exposing a part of the second pad electrode 920_1. That is, the first via-insulating layers VIA1 may be symmetrically disposed to be spaced apart from each other in the first direction DR1 with the top surface of the second pad electrode 920_1 interposed therebetween, cover opposite edges of the top surface and opposite side surfaces of the second pad electrode 920_1, and form an opening exposing the central portion of the top surface of the second pad electrode 920_1. That is, the first via-insulating layer VIA1 may conformally reflect the lower stepped portion formed by the first pad electrode 910_1 and the second pad electrode 920_1 disposed on the substrate SUB.

Further, the first via-insulating layer VIA1 may cover the edge of the top surface and opposite side surfaces of the second pad electrode 920_1, further extend in the first direction DR1 to be in direct contact with the substrate SUB, and cover the top surface of the substrate SUB.

The insulating members DEL_1 may be disposed on the first via-insulating layer VIA1 while exposing a part of the top surface of the first via-insulating layer VIAL That is, a part of the insulating member DEL_1 may overlap an end portion including a part of the top surface and the side surfaces of the second pad electrode 920_1 with the first via-insulating layer VIA1 interposed therebetween in the third direction DR3.

Figure 17:
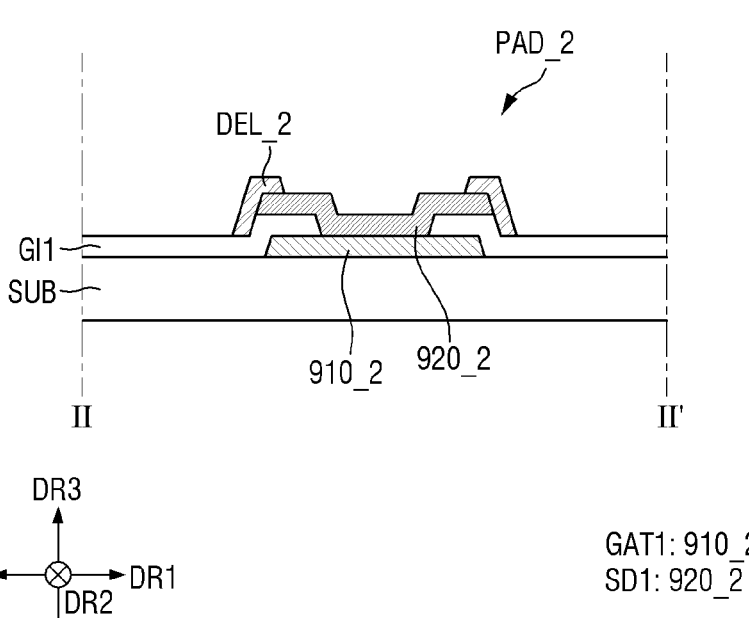
FIGS. 17 to 22 are cross-sectional views taken along line II-IP of FIG. 8 according to other embodiments.

Referring to FIG. 17, unlike the embodiment of FIG. 15, the first gate insulating layer GI1 is disposed between a first pad electrode 910_2 and a second pad electrode 920_2, and an insulating member DEL_2 is in contact with the second pad electrode 920_2 and the first gate insulating layer GI1.

Specifically, the first gate insulating layer GI1 may be disposed on the first pad electrode 910_2. The first gate insulating layer Gil may be disposed on the first pad electrode 910_2 while conformally reflecting the lower stepped portion formed by the first pad electrode 910_2 disposed on the substrate SUB, and may include an opening exposing a part of the central portion of the top surface of the first pad electrode 910_2. The first gate insulating layer GI1 may include a first top surface that overlaps the first pad electrode 910_2 in the third direction DR3 and a second top surface that does not overlap the first pad electrode 910_2, and the first top surface may be positioned higher than the second top surface. Although the embodiment illustrates that the insulating layer disposed between the first pad electrode 910_2 and the second pad electrode 920_2 is the first gate insulating layer GI1, the disclosure is not limited thereto and, in some embodiments, the insulating layer disposed between the pad electrode 910_2 and the second pad electrode 920_2 may be the second gate insulating layer GI2.

The second pad electrode 920_2 may be disposed on the first gate insulating layer GI1, and may be electrically connected to the first pad electrode 910_2. Specifically, the second pad electrode 920_2 may be disposed on the first top surface of the first gate insulating layer GI1 while being in contact with the first top surface of the first gate insulating layer GI1, and may be in direct contact with the central portion of the top surface of the first pad electrode 910_2 exposed by the opening of the first gate insulating layer GI1 while filling the opening of the first gate insulating layer GI1.

The second pad electrode 920_2 may include a first top surface overlapping the first top surface of the first gate insulating layer GI1 in the third direction DR3 and a second top surface overlapping the opening formed by the first gate insulating layer GI1 in the third direction DR3, and the first top surface may be positioned higher than the second top surface.

The insulating members DEL_2 may be disposed on the second pad electrode 920_2 while covering end portions including opposite edges of the first top surface and opposite side surfaces of the second pad electrode 920_2. That is, the insulating members DEL_2 may be spaced apart from each other in the first direction DR1 while being in contact with a part of the first top surface of the second pad electrode 920_2 and exposing a part of the first top surface and the second top surface, and the insulating members DEL_2 may be in contact with the first gate insulating layer GI1.

Figure 18:
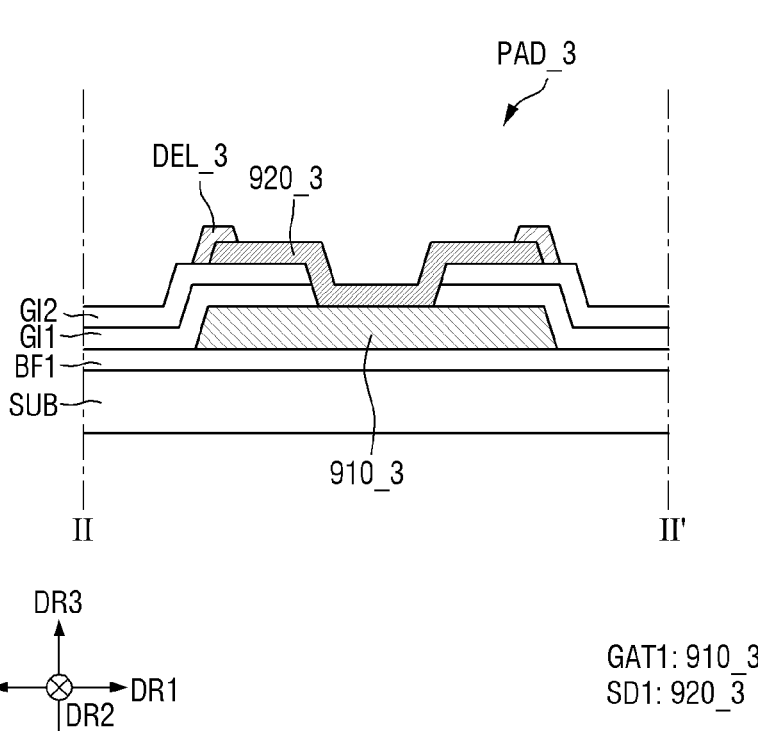

Referring to FIG. 18, unlike the embodiment of FIG. 17, the first buffer layer BF1 is further disposed between the substrate SUB and a first pad electrode 910_3, the second gate insulating layer GI2 is further disposed between the first pad electrode 910_3 and a second pad electrode 920_3, and the first pad electrode 910_3 and the second pad electrode 920_3 have different thicknesses.

Specifically, unlike the embodiment of FIG. 17, the first pad electrode 910_3 may be disposed on the first buffer layer BF1, and the first gate insulating layer GI1 may be in direct contact with the first buffer layer BF1.

The second gate insulating layer GI2 may be further disposed on the first gate insulating layer GI1, and a part of the central portion of the top surface of the first pad electrode 910_3 may be exposed by an opening penetrating the first gate insulating layer GI1 and the second gate insulating layer GI2 in the thickness direction.

The second gate insulating layer GI2 may include a first top surface that overlaps the first pad electrode 910_3 in the third direction DR3 and a second top surface that does not overlap the first pad electrode 910_3, and the first top surface may be positioned higher than the second top surface.

Although the embodiment illustrates that the insulating layers disposed between the first pad electrode 910_3 and the second pad electrode 920_3 are the first gate insulating layer GI1 and the second gate insulating layer GI2, the disclosure is not limited thereto, and in some embodiments, the insulating layers disposed between the first pad electrode 910_3 and the second pad electrode 920_3 may be the first gate insulating layer GI1 and the interlayer-insulating layer ILD or may be the second gate insulating layer GI2 and the interlayer-insulating layer ILD.

The second pad electrode 920_3 may be disposed on the second gate insulating layer GI2, and may be electrically connected to the first pad electrode 910_3. Specifically, the second pad electrode 920_3 may be disposed on the first top surface of the second gate insulating layer GI2 while being in contact with the first top surface of the second gate insulating layer GI2, and may be in direct contact with the central portion of the top surface of the first pad electrode 910_3 exposed by the opening formed by the first gate insulating layer GI1 and the second gate insulating layer GI2 while filling the opening formed by the first gate insulating layer GI1 and the second gate insulating layer GI2.

The second pad electrode 920_3 may include a first top surface overlapping the first top surface of the second gate insulating layer GI2 in the third direction DR3 and a second top surface overlapping the opening formed by the first gate insulating layer GI1 and the second gate insulating layer GI2 in the third direction DR3, and the first top surface may be positioned higher than the second top surface. Further, in the embodiment, the thickness of the first pad electrode 910_3 may be greater than the thickness of the second pad electrode 920_3. However, the disclosure is not limited thereto.

Insulating members DEL_3 may be disposed on the second pad electrode 920_3 while covering end portions including opposite edges of the first top surface and opposite side surfaces of the second pad electrode 920_3. That is, the insulating members DEL_3 may be spaced apart from each other in the first direction DR1 while being in contact with a part of the first top surface of the second pad electrode 920_3 and exposing a part of the first top surface and the second top surface, and the insulating members DEL_3 may be in contact with the second gate insulating layer GI2.

Although the embodiment illustrates that the insulating members DEL_3 cover a part of the first top surface and the side surfaces of the second pad electrode 920_3, the disclosure is not limited thereto and, in some embodiments, the insulating members DEL_3 may further extend in the first direction DR1 to cover the entire first top surface of the second pad electrode 920_3 and expose the second top surface of the second pad electrode 920_3.

Figure 19:
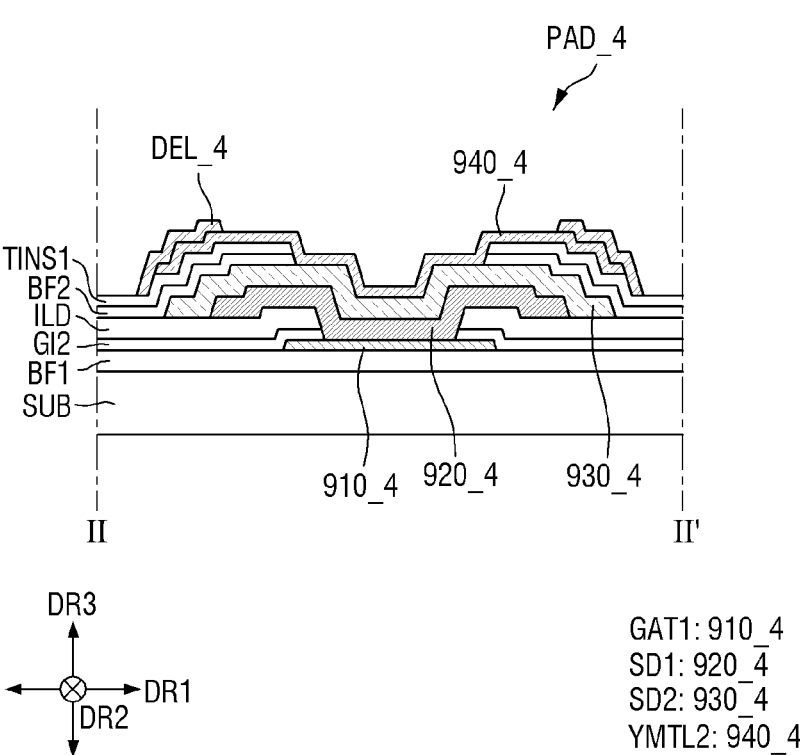

Referring to FIG. 19, unlike the embodiment of FIG. 18, a third pad electrode 930_4 and a fourth pad electrode 940_4 are further included, and the second buffer layer BF2 and the first sensor insulating layer TINS1 are further included between the third pad electrode 930_4 and the fourth pad electrode 940_4.

Specifically, unlike the embodiment of FIG. 18, in the embodiment, the insulating layers positioned between a first pad electrode 910_4 and a second pad electrode 920_4 may be the second gate insulating layer GI2 and the interlayer-insulating layer ILD. That is, the second gate insulating layer GI2 and the interlayer-insulating layer ILD may be sequentially disposed on the first pad electrode 910_4, and a part of the central portion of the top surface of the first pad electrode 910_4 may be exposed by a first opening penetrating the second gate insulating layer GI2 and the interlayer-insulating layer ILD in the thickness direction. As shown in FIG. 19, the thickness of the interlayer-insulating layer ILD may be greater than the thickness of the second insulating layer GI2.

The interlayer-insulating layer ILD may include a first top surface that overlaps the first pad electrode 910_4 in the third direction DR3 and a second top surface that does not overlap the first pad electrode 910_4, and the first top surface may be positioned higher than the second top surface.

The second pad electrode 920_4 may be disposed on the interlayer-insulating layer ILD, and may be electrically connected to the first pad electrode 910_4. Specifically, the second pad electrode 920_4 may be disposed on the first top surface of the interlayer-insulating layer ILD while being in contact with the first top surface and the second top surface of the interlayer-insulating layer ILD, and may be in direct contact with the central portion of the top surface of the first pad electrode 910_4 exposed by the first opening while filling the opening formed by the second gate insulating layer GI2 and the interlayer-insulating layer ILD.

The third pad electrode 930_4 may be disposed on the second pad electrode 920_4. Specifically, the third pad electrode 930_4 may completely cover the second pad electrode 920_4 including opposite end portions of the second pad electrode 920_4, and may be in direct contact with the second pad electrode 920_4. In the embodiment, the third pad electrode 930_4 and the second conductive layer SD2 may be formed by the same process and may include the same material. That is, the third pad electrode 930_4 may include the same material as those of the data line DL and the connection electrode CNE described above.

The second buffer layer BF2 and the first sensor insulating layer TINS1 may be sequentially disposed between the third pad electrode 930_4 and the fourth pad electrode 940_4. Specifically, the second buffer layer BF2 may cover a part of the top surface of the third pad electrode 930_4 and the end portion of the third pad 930_4 overlapping the first top surface of the interlayer-insulating layer ILD in the third direction DR3, and may expose a part of the top surface of the third pad electrode 930_4. That is, the second buffer layer BF2 may be disposed on the third pad electrode 930_4, and may expose a part of the top surface of the third pad electrode 930_4 overlapping the first top surface of the interlayer-insulating layer ILD in the third direction DR3 and the top surface of the third pad electrode 930_4 overlapping the first opening formed by the second gate insulating layer GI2 and the interlayer-insulating layer ILD in the third direction DR3. Further, the second buffer layer BF2 may be in direct contact with the top surface of the interlayer-insulating layer ILD that does not overlap the first pad electrode 910_4 in the third direction DR3.

The first sensor insulating layer TINS1 may be disposed on the second buffer layer BF2, and the distal end of the first sensor insulating layer TINS1 may coincide with the distal end of the second buffer layer BF2. That is, a part of the top surface of the third pad electrode 930_4 may be exposed through a second opening penetrating the second buffer layer BF2 and the first sensor insulating layer TINS1 in the thickness direction (i.e., the third direction DR3).

The fourth pad electrode 940_4 may be disposed on the first sensor insulating layer TINS1, and may be in direct contact with the top surface of the third pad electrode 930_4 exposed by the second opening. That is, the fourth pad electrode 940_4 may be disposed on the first sensor insulating layer TINS1 while covering a part of the top surface of the first sensor insulating layer TINS' and a part of the end portions of the first sensor insulating layer TINS1, and the end portions of the pad electrode 940_4 may overlap the end portions of the third pad electrode 930_4 in the third direction DR3. Further, the fourth pad electrode 940_4 may be in direct contact with the top surface of the third pad electrode 930_4 exposed by the second opening while filling the second opening.

The fourth pad electrode 940_4 and the second sensing electrode YMTL2 may be formed by the same process and may include the same material. That is, the fourth pad electrode 940_4 may include the same material as those of the driving electrodes TE and the sensing electrode RE.

Insulating members DEL_4 may be disposed on the fourth pad electrode 940_4 and may expose a part of the top surface of the fourth pad electrode 940_4. Specifically, the insulating members DEL_4 may cover a part of the top surface of the fourth pad electrode 940_4 positioned on the uppermost layer in a cross-sectional view and the end portions of the fourth pad electrode 940_4, and may be in direct contact with the first sensor insulating layer TINS1 while exposing a part of the top surface of the fourth pad electrode 940_4. That is, the insulating members DEL_4 may expose a part of the top surface of the fourth pad electrode 940_4 positioned on the uppermost layer in a cross-sectional view and the top surface of the fourth pad electrode 940_4 overlapping the second opening.

However, the disclosure is not limited thereto, and in some embodiments, the insulating members DEL_4 may further extend in the first direction DR1 to cover the entire top surface of the fourth pad electrode 940_4 positioned on the uppermost layer in a cross-sectional view.

In the embodiment, the thickness of the first pad electrode 910_4 may be the same as that of the fourth pad electrode 940_4, and may be smaller than the thicknesses of the second pad electrode 920_4 and the third pad electrode 930_4. Further, the width in the first direction DR1 may increase from the first pad electrode 910_4 toward the third pad electrode 930_4, and the width of the third pad electrode 930_4 may be the same as the width of the fourth pad electrode 940_4. However, the disclosure is not limited thereto.

Figure 20:
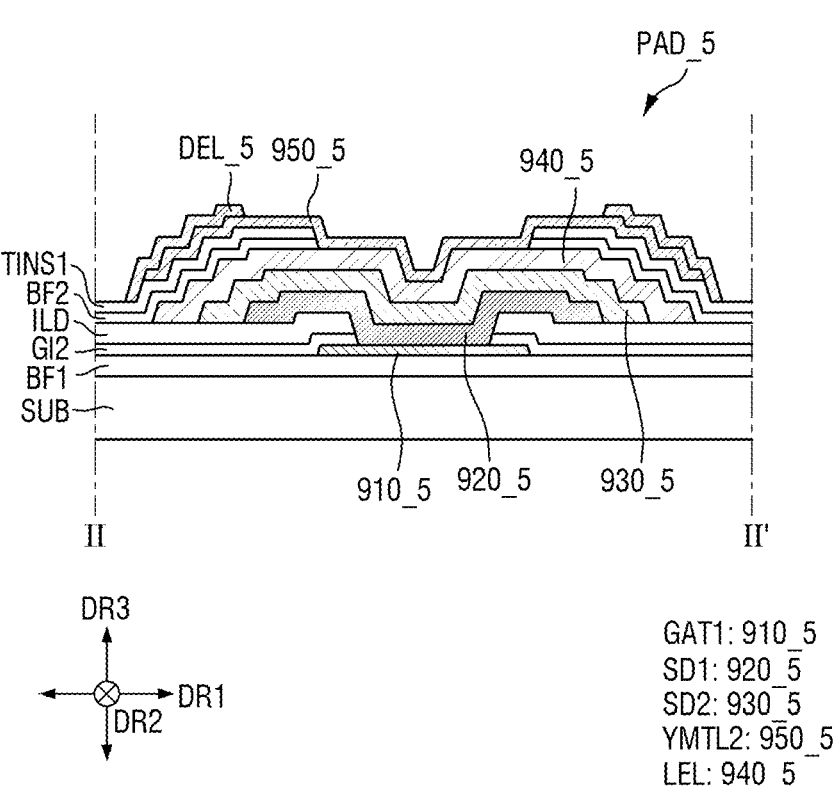

Referring to FIG. 20, unlike the embodiment of FIG. 19, a fourth pad electrode 940_5 is further disposed between a third pad electrode 930_5 and the second buffer layer BF2.

Specifically, the fourth pad electrode 940_5 may be disposed on the third pad electrode 930_5. That is, the fourth pad electrode 940_5 may completely cover the third pad electrode 930_5, and may be in direct contact with the third pad electrode 930_5. In the embodiment, the fourth pad electrode 940_5 and the anode electrode ANO of the light emitting element LEL described in conjunction with FIG. 7 may be formed by the same process and may include the same material. That is, the fourth pad electrode 940_5 may include the same material as that of the anode electrode ANO described above. However, the disclosure is not limited thereto.

In the embodiment, the width of the fourth pad electrode 940_5 in the first direction DR1 may be greater than the width of the third pad electrode 930_5 in the first direction DR1, and may be substantially the same as the width of a fifth pad electrode 950_5 to be described later in the first direction DR1. The fifth pad electrode 950_5 of the embodiment may be substantially the same as the fourth pad electrode 940_4 (see FIG. 19) of the embodiment of FIG. 19.

Figure 21:
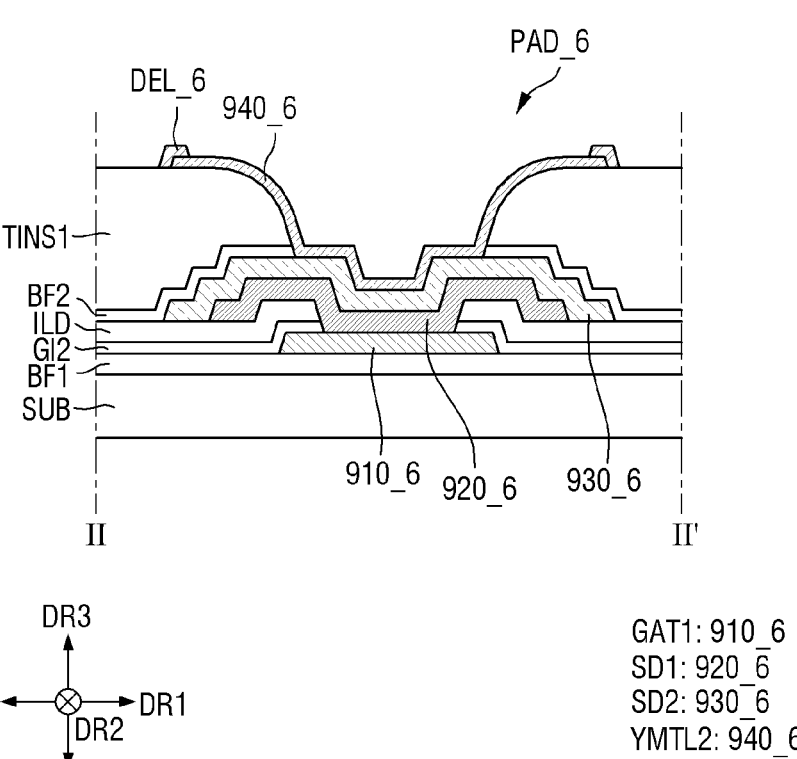

Referring to FIG. 21, unlike the embodiment of FIG. 19, the thickness of the first pad electrode 910_6 is substantially the same as those of the second pad electrode 920_6 and the third pad electrode 930_6 and greater than the thickness of the fourth pad electrode 940_6, and the first sensor insulating layer TINS1 disposed between the second buffer layer BF2 and the fourth pad electrode 940_6 is thicker.

Specifically, in the embodiment, as described above, the first sensor insulating film TINS1 may be formed of or include an organic layer such as acrylic resin, epoxy resin, phenolic resin, polyamide resin, polyimide resin, or the like.

When the first sensor insulating layer TINS1 is made of an organic material, the coverage is improved compared to when it is made of an inorganic material, so that the first sensor insulating layer TINS' may be thickly formed.

Further, unlike the embodiment of FIG. 19, the first sensor insulating layer TINS1 according to the embodiment may partially include a curved surface. Accordingly, the fourth pad electrode 940_6 disposed on the curved surface of the first sensor insulating layer TINS1 may also partially include a curved surface.

Although the embodiment illustrates that an insulating member DEL_6 may be in contact with the first sensor insulating layer TINS1 while covering a part of the top surface and the side surfaces of the fourth pad electrode 940_6, the embodiment is not limited thereto and, in some embodiments, the insulating member DEL_6 may further extend toward the central portion of the fourth pad electrode 940_6.

Figure 22:
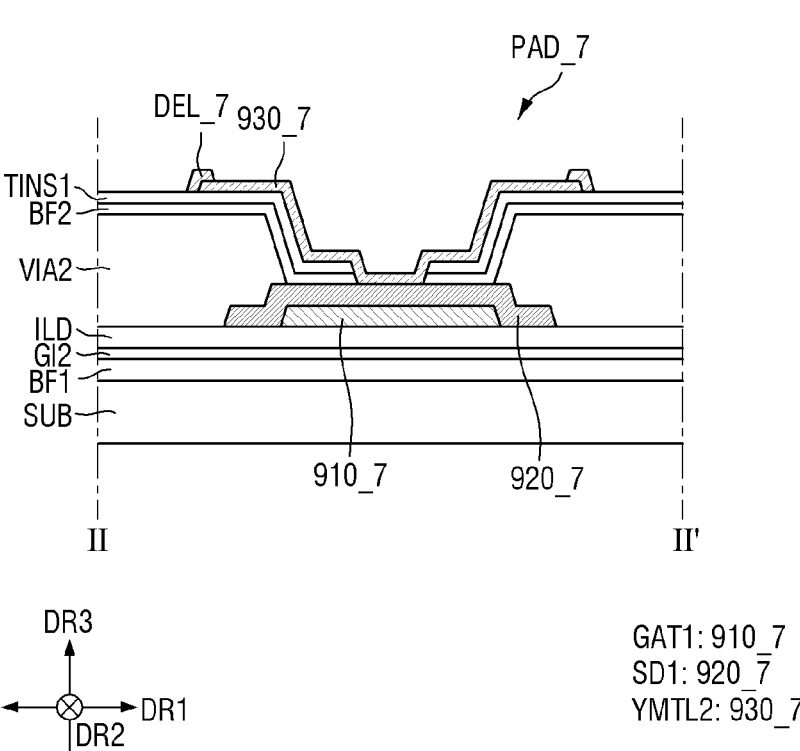

Referring to FIG. 22, unlike the embodiment of FIG. 20, a first pad electrode 910_7 and a second pad electrode 920_7 are sequentially disposed on the interlayer-insulating layer ILD, and a display pad PAD_7 includes three pad electrodes because the third pad electrode 930_6 (see FIG. 19) is omitted. Further, they are different in that the second via-insulating layer VIA2 is further included between the interlayer-insulating layer ILD and the second buffer layer BF2.

Specifically, the thickness of the first pad electrode 910_7 according to the embodiment may be greater than the thickness of the first pad electrode 910_4 according to the embodiment according to FIG. 19, and the thickness of the first pad electrode 910_7 may be substantially the same as that of the second pad electrode 920_7 and greater than the thickness of the third pad electrode 930_7. However, the disclosure is not limited thereto.

Further, the second pad electrode 920_7 may extend outward from the first pad electrode 910_7 to completely cover the top surface and the side surfaces of the first pad electrode 910_7 and may be in direct contact with the interlayer-insulating layer ILD. The second via-insulating layer VIA2 may conformally reflect the lower stepped portion formed by the first pad electrode 910_7 and the second pad electrode 920_7 disposed on the interlayer-insulating layer ILD. The second via-insulating layer VIA2 may cover the end portions of the second pad electrode 920_7 and form a first opening exposing a part of the central portion of the top surface of the second pad electrode 920_7. The thickness of the second via-insulating layer VIA2 may be greater than a plurality of insulating layers included in the display pad PAD_7.

The second buffer layer BF2 and the first touch insulating layer TINS1 may be sequentially disposed on the second via-insulating layer VIA2 while completely covering the top surface and the side surfaces of the second via-insulating layer VIA2, and the buffer layer BF2 and the first touch insulating layer TINS1 may include a second opening exposing a part of the central portion of the top surface of the second pad electrode 920_7 and penetrating the second buffer layer BF2 and the first touch insulating layer TINS1 in the thickness direction.

The third pad electrode 930_7 may be disposed on the first touch insulating layer TINS1 and expose a part of the top surface of the first touch insulating layer TINS1 overlapping the top surface of the second via-insulating layer VIA2 in the third direction DR3, and the third pad electrode 930_7 may be in direct contact with the second pad electrode 920_7 while filling the second opening. Accordingly, the first pad electrode 910_7, the second pad electrode 920_7, and the third pad electrode 930_7 may overlap in the third direction DR3.

Further, the third pad electrode 930_7 may fill the second opening, and may be in contact with the side surfaces of the second buffer layer BF2 and the first touch insulating layer TINS1 forming the inner walls of the second opening. The third pad electrode 930_7 of the embodiment may be substantially the same as the fourth pad electrode 940_4 of the embodiment shown in FIG. 19 except the arrangement position and the shape.

Insulating members DEL_7 may be disposed on the third pad electrode 930_7 while covering the end portions including a part of the top surface and the side surfaces of the third pad electrode 930_7, and may be in contact with the first touch insulating layer TINS1. Although the embodiment illustrates the insulating members DEL_7 covers only the end portions of the third pad electrode 930_7, the disclosure is not limited thereto and, in some embodiments, the insulating members DEL_7 may further extend toward the central portion of the third pad electrode 930_7 to cover the entire top surface of the third pad electrode 930_7 positioned on the uppermost layer in a cross-sectional view.

In accordance with the above-described various embodiments, the insulating members DEL are disposed at opposite corner portions and the side surfaces of the display pad PAD, so that it is possible to prevent a short circuit problem caused by the misalignment of the plurality of lead electrodes LE and/or the plurality of display pads PAD during bonding of the lead electrode LE and the display pad PAD by the conductive balls 710 and 711 positioned between the lead electrode LE and the display pad PAD, and also possible to prevent a narrow line gap and a short circuit problem that may occur during high voltage driving, thereby improving the reliability of the display device.

Figure 23:
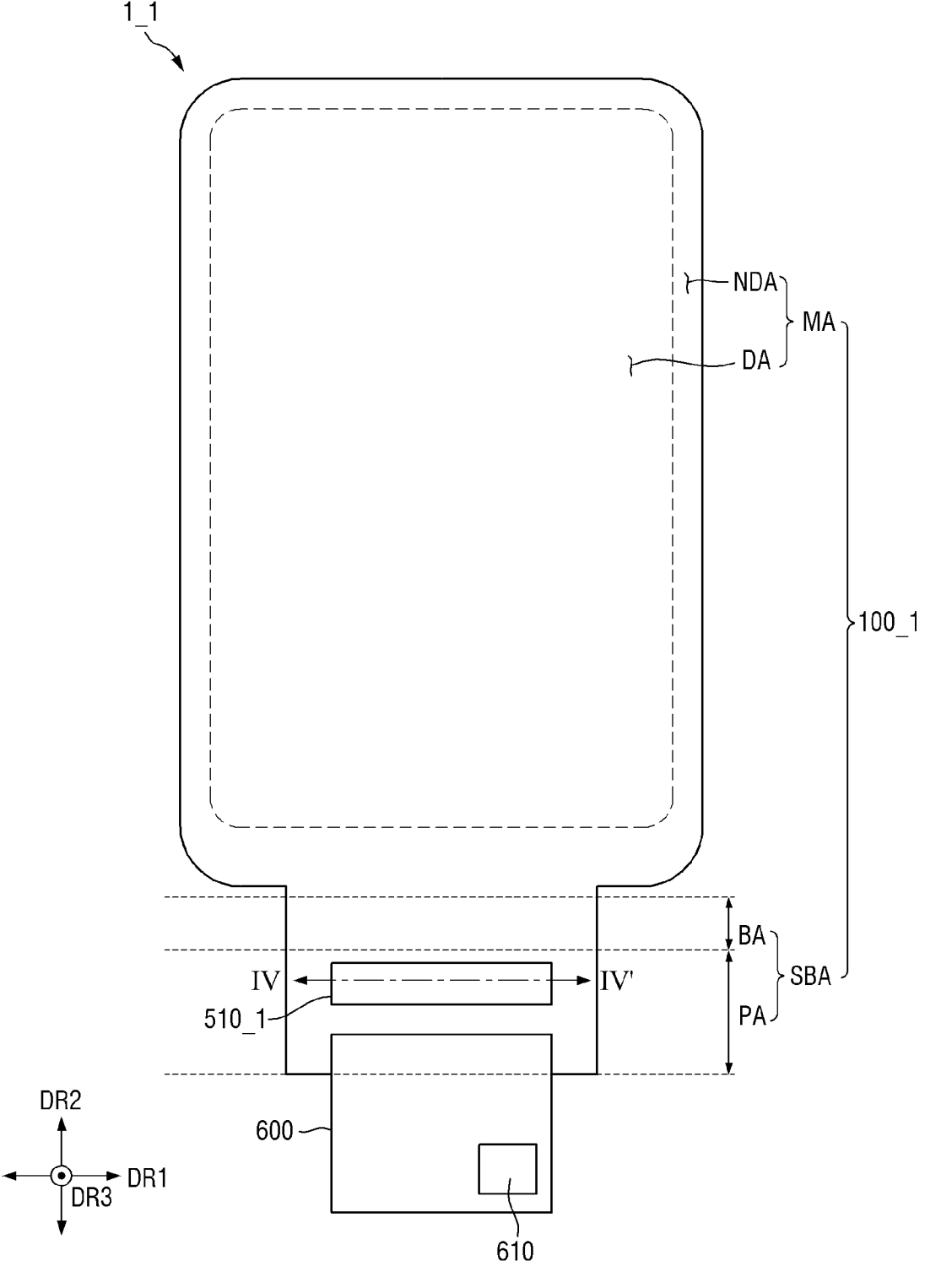
FIG. 23 is a plan view of a display device according to another embodiment.
Figure 24:
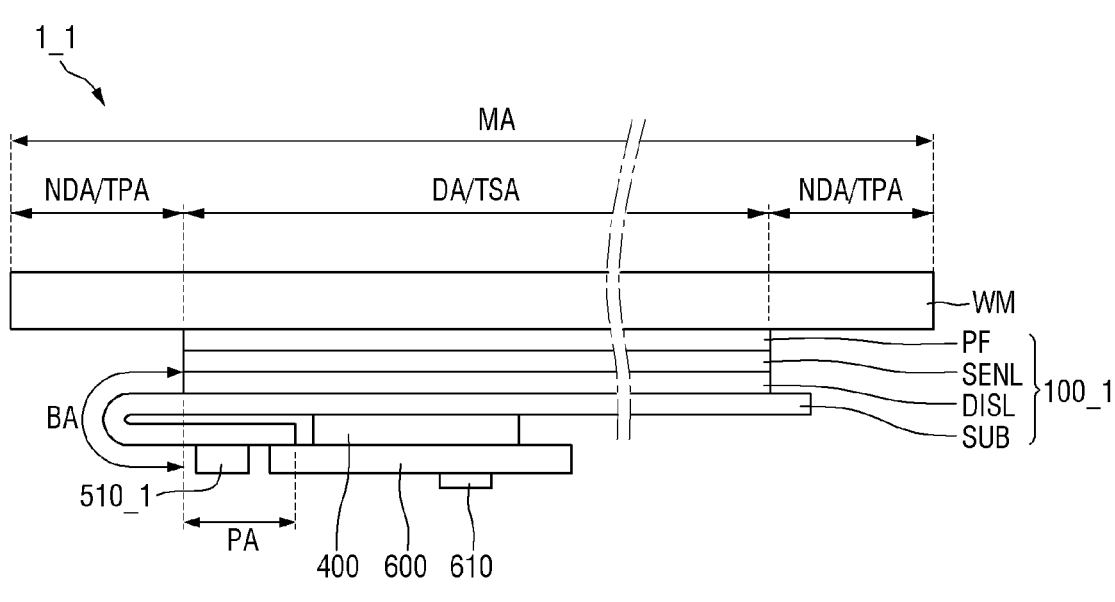
FIG. 24 is one side view showing a display panel and a display driver according to another embodiment.
Figure 24:
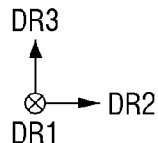

FIG. 23 is a plan view of a display device according to another embodiment. FIG. 24 is one side view showing a display panel and a display driver according to another embodiment.

Referring to FIGS. 23 and 24, a display device 1_1 according to another embodiment may include a main region MA and a sub-region SBA. The main region MA may indicate an area in which the sub-pixels PX are formed to display an image, and may include a display area DA displaying an image, and a non-display area NDA that is a peripheral area of the display area DA.

The sub-region SBA may protrude from one side of the main region MA in the second direction DR2. The length of the sub-region SBA in the first direction DR1 may be smaller than the length of the main region MA in the first direction DR1, and the length of the sub-region SBA in the second direction DR2 may be smaller than the length of the main region MA in the second direction DR2, but the disclosure is not limited thereto.

The sub-region SBA may include a bending area BA and a pad area PA. The bending area BA may be disposed between the main region MA and the pad area PA. The bending area BA may be bent in the third direction DR3, so that the pad area PA may be disposed under the main region MA.

In the sub-region SBA, a driver integrated circuit 510_1 and the main circuit board 600 may be disposed. Unlike the embodiment of FIGS. 1 and 2, in the embodiment, the driver integrated circuit 510_1 may be disposed in the sub-region SBA of a display panel 100_1. The driver integrated circuit 510_1 may be formed as an integrated circuit ("IC") and attached to a first pad PAD_1 (see FIGS. 25 and 27) of the sub-region SBA of the display panel 100_1 by a chip on glass (COG) method, a chip on plastic (COP) method, or an ultrasonic bonding method. Accordingly, the driver integrated circuit 510_1 may be electrically connected to the first pad PAD_1. Alternatively, in some embodiments, the driver integrated circuit 510_1 may be attached to the main circuit board 600.

The main circuit board 600 may be disposed in the sub-region SBA of the display panel 100_1 using an anisotropic conductive film, and the main circuit board 600 may be electrically connected to a second pad PAD_2. Further, the main circuit board 600 may be attached to the second pad PAD_2 (see FIG. 25) by a film on plastic ("FOP") method, a film on glass ("FOG") method, or an ultrasonic bonding method.

Figure 25:
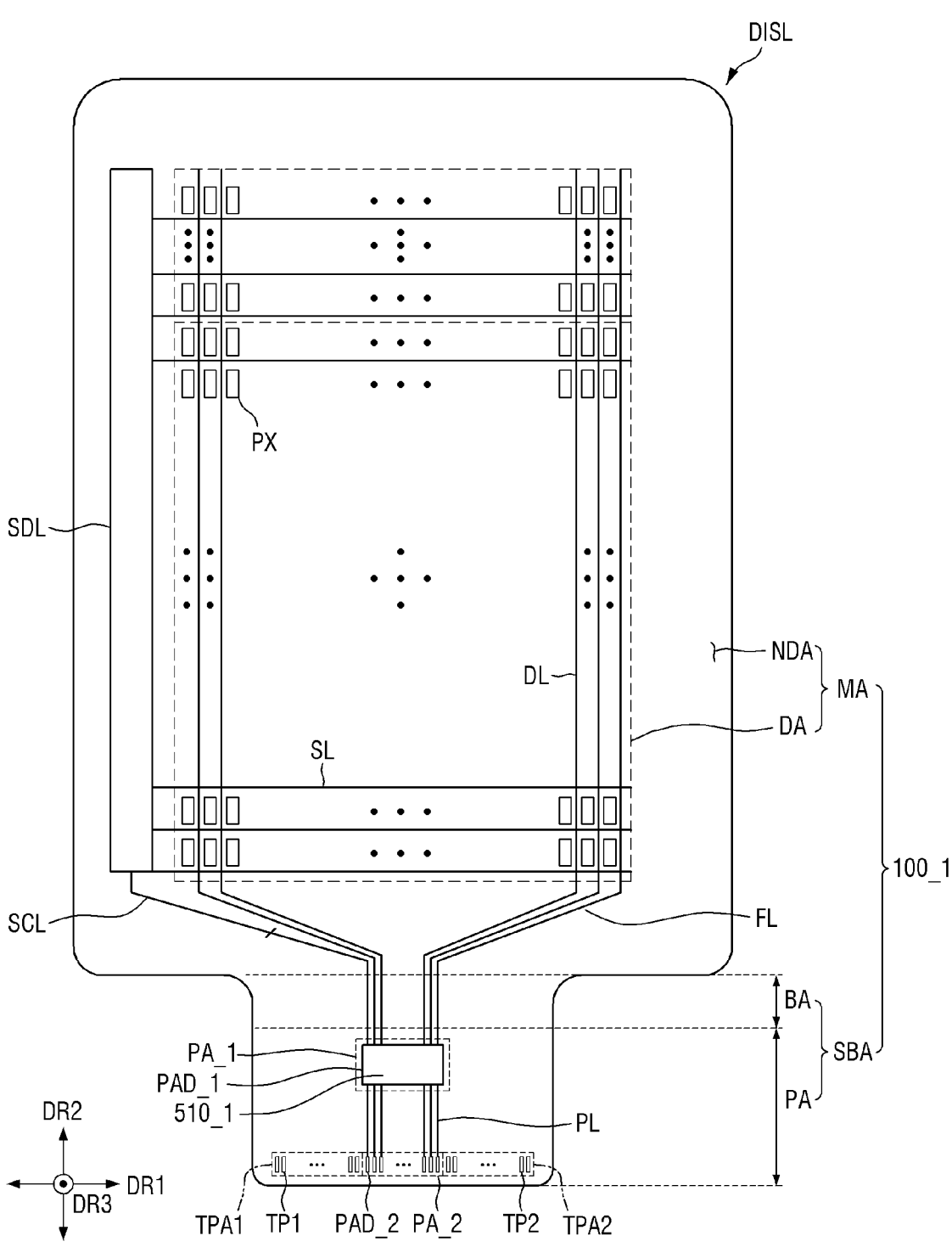
FIG. 25 is a plan view illustrating components related to the display unit of FIG. 24 according to another embodiment.

FIG. 25 is a plan view illustrating components related to the display unit of FIG. 24 according to another embodiment.

Referring to FIG. 25, unlike the embodiment of FIG. 3, the pad area PA may include a pad area PA_1 including the first pads PAD_1 (see FIG. 27) overlapping the driver integrated circuit 510_1 in the thickness direction (i.e., the third direction DR3) and a second pad area PA 2 including the second pads PAD_2 arranged in the first direction DR1 while being spaced apart from the first pads PAD_1 in the second direction DR2.

Specifically, the first pads PAD_1 may form a first row, and the second pads PAD_2 may form a second row while being spaced apart from the first row in the second direction DR2 and may be disposed on the pad area PA. That is, the first pads PAD_1 forming the first row may be disposed adjacent to the bending area BA compared to the second pads PAD_2 forming the second row, and the second pads PAD_2 forming the second row may be disposed at the distal end of the sub-region SBA positioned in the opposite direction to the bending area BA.

As shown in FIG. 4, the scan driver SDL may be connected to the first pads PAD_1 through the plurality of scan control lines SCL, and thus may receive a scan control signal from the driver integrated circuit 510_1 disposed to overlap the first pads PAD_1.

Fan-out lines FL may be disposed in the bending area BA and the pad area PA. The gap between the fan-out lines FL adjacent in the first direction DR1 in the sub-region SBA may be smaller than the gap between the fan-out lines FL adjacent in the first direction DR1 in the non-display area NDA of the main region MA. The first pads PAD_1 may be connected to the display area DA through the fan-out lines FL connecting the data lines DL and the first pads PAD_1.

The second pads PAD_2 may be connected to the driver integrated circuit 510_1 through pad lines PL. Therefore, the driver integrated circuit 510_1 may be electrically connected to the main circuit board 600 through the second pads PAD_2.

Figure 26:
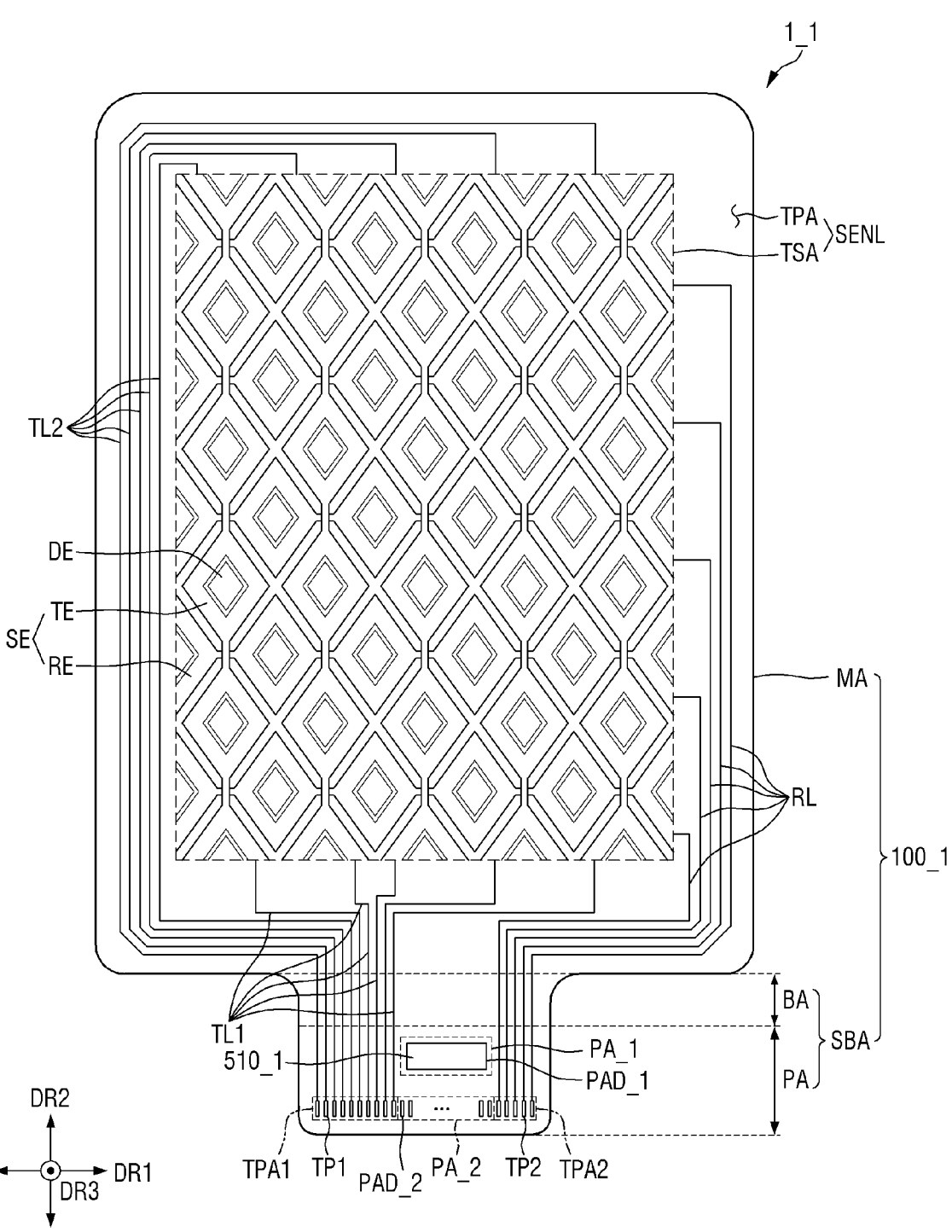
FIG. 26 is a plan view schematically illustrating an example of the sensing unit of FIG. 24 according to another embodiment.

FIG. 26 is a plan view schematically illustrating an example of the sensing unit of FIG. 24 according to another embodiment.

Referring to FIG. 26, unlike the embodiment of FIG. 4, a first sensor pad area TPA1 in which the first sensor pads TP1 are disposed and a second sensor pad area TPA2 in which the second sensor pads TP2 are disposed are disposed with second pad area PA 2 in which the second pads PAD_2 are disposed interposed therebetween.

Further, in the embodiment, unlike the embodiment of FIG. 4, the main circuit board 600 may be disposed on the second pads PAD_2, the first sensor pads TP1, and the second sensor pads TP2. That is, the second pads PAD_2, the first sensor pads TP1, and the second sensor pads TP2 may be directly connected to the main circuit board 600 through the anisotropic conductive film. Therefore, the second pads PAD_2, the first sensor pads TP1, and the second sensor pads TP2 may be electrically connected to the sensing driver 610 disposed on the main circuit board 600.

Figure 27:
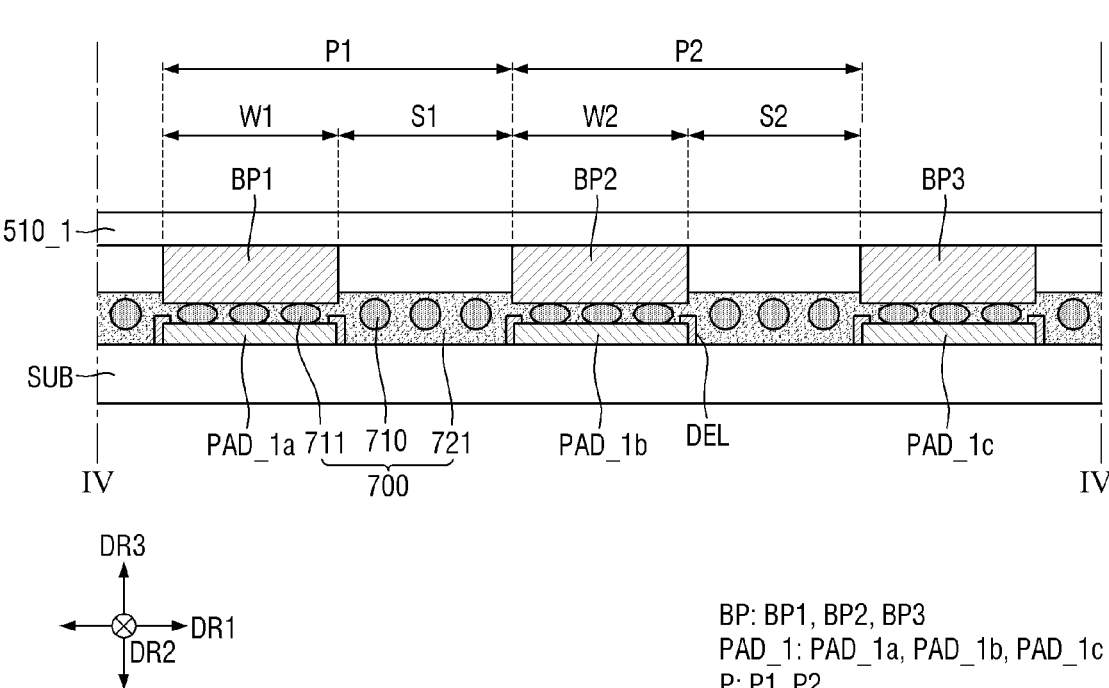
FIG. 27 is a cross-sectional view taken along line IV-IV' of FIG. 23.

FIG. 27 is a cross-sectional view taken along line IV-IV' of FIG. 23.

Referring to FIG. 27, unlike the embodiment of FIG. 13, the plurality of first display pads PAD_1 are disposed on one surface of the substrate SUB facing the driver integrated circuit 510_1, and a plurality of bump electrodes BP are disposed on one surface of the driver integrated circuit 510_1 facing the substrate SUB. In an embodiment, the plurality of first display pads PAD_1 may include the first display pads PAD_1a, PAD_1b, and PAD 1c, and the plurality of bump electrodes BP may include the bump electrodes BP1, BP2, and BP3.

The description of the lead electrode LE and display pad PAD may be substantially equally applied to the bump electrode BP disposed on one surface of the driver integrated circuit 510_1 and the first display pad PAD_1 disposed on one surface of the substrate SUB. That is, the lead electrode LE may correspond to the bump electrode BP, and the display pad PAD may correspond to the first pad PAD_1.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:

a substrate;

a display pad disposed on the substrate; and a circuit board comprising an electrode facing the display pad, wherein the display pad comprises:

a first pad electrode disposed on the substrate, a second pad electrode disposed on the first pad electrode, overlapping the first pad electrode in a plan view, and electrically connected to the first pad electrode, and insulating members spaced apart from each other with a top surface of the second pad electrode interposed therebetween, and disposed on the second pad electrode while covering opposite edges of the top surface of the second pad electrode and opposite side surfaces of the second pad electrode, wherein a height of a top surface of each of the insulating members is higher than a height of a portion of the top surface of the second pad electrode exposed by the insulating members.

2. The display device of claim 1, further comprising an anisotropic conductive film disposed between the substrate and the circuit board and comprising a base resin and a conductive ball dispersed in the base resin, wherein the conductive ball contains a core made of a polymer material and at least one metal layer surrounding the core, wherein the conductive ball is in contact with the electrode of the circuit board and the portion of the top surface of the second pad electrode exposed by the insulating members.

3. The display device of claim 1, wherein the insulating members are disposed to extend toward a central portion of the second pad electrode, and wherein the insulating members expose a central portion of the top surface of the second pad electrode.

4. The display device of claim 1, wherein the display pad further comprises a first insulating layer comprising at least one layer disposed between the first pad electrode and the second pad electrode, wherein the first insulating layer exposes a part of a top surface of the first pad electrode.

5. The display device of claim 4, further comprising a buffer layer disposed between the substrate and the first pad electrode, wherein the display pad further comprises:

a third pad electrode disposed on the first pad electrode and in contact with the first pad electrode, and a fourth pad electrode disposed between the second pad electrode and the third pad electrode and in contact with the second pad electrode, wherein the first pad electrode, the second pad electrode, the third pad electrode, and the fourth pad electrode overlap each other in the plan view, and wherein the first pad electrode, the second pad electrode, the third pad electrode, and the fourth pad electrode are electrically connected.

6. The display device of claim 5, wherein the third pad electrode is in contact with the first insulating layer, and wherein the fourth pad electrode extends outward from the third pad electrode to completely cover the third pad electrode.

7. The display device of claim 5, wherein the display pad further comprises a second insulating layer comprising at least one layer disposed between the second pad electrode and the fourth pad electrode, wherein the second insulating layer exposes a part of a top surface of the fourth pad electrode, and wherein the second insulating layer is in contact with the insulating members.

8. The display device of claim 7, wherein the display pad further comprises a fifth pad electrode disposed between the third pad electrode and the fourth pad electrode, and overlapping the first pad electrode, the second pad electrode, the third pad electrode, and the fourth pad electrode in the plan view while being electrically connected thereto, and wherein the fifth pad electrode is in contact with the third pad electrode and the fourth pad electrode.

9. The display device of claim 8, wherein the fourth pad electrode extends outward from the fifth pad electrode to completely cover the fifth pad electrode, and wherein the fifth pad electrode extends outward from the third pad electrode to completely cover the third pad electrode.

10. The display device of claim 7, wherein the second insulating layer comprises at least one inorganic layer and at least one organic layer, wherein the organic layer partially comprises a curved surface, and wherein the second pad electrode disposed on the curved surface of the organic layer partially comprises a curved surface.

11. The display device of claim 8, wherein at least one of thicknesses of the first pad electrode, the second pad electrode, the third pad electrode, the fourth pad electrode, and the fifth pad electrode is different.

12. The display device of claim 8, wherein sizes of the first pad electrode, the second pad electrode, the third pad electrode, the fourth pad electrode, and the fifth pad electrode are different from each other.

13. The display device of claim 1, further comprising a buffer layer disposed between the first pad electrode and the substrate, wherein the display pad further comprises:

a third pad electrode disposed between the first pad electrode and the second pad electrode and overlapping the first pad electrode and the second pad electrode in the plan view, a first insulating layer disposed between the first pad electrode and the buffer layer and comprising at least one layer, and a second insulating layer disposed between the second pad electrode and the third pad electrode and comprising at least one inorganic layer and at least one organic layer, wherein the second insulating layer exposes a part of a top surface of the third pad electrode, and wherein the third pad electrode is in contact with the second pad electrode, the first insulating layer, and the second insulating layer.

14. A display device comprising a display area comprising a thin film transistor and a non-display area disposed around the display area and comprising a pad area, the display device comprising:

a substrate;

a first insulating layer comprising at least one layer disposed on the substrate;

a first conductive layer disposed on the first insulating layer;

a second insulating layer disposed on the first conductive layer and comprising at least one layer;

a second conductive layer disposed on the second insulating layer; and a display pad disposed in the pad area, wherein the display pad comprises:

a first pad electrode disposed on the substrate, a second pad electrode disposed on the first pad electrode, overlapping the first pad electrode in a plan view, and electrically connected to the first pad electrode, and insulating members covering opposite side surfaces and opposite edges of a top surface of the second pad electrode and exposing a part of the top surface of the second pad electrode, wherein a height of a top surface of each of the insulating members is higher than a height of a portion of the top surface of the second pad electrode exposed by the insulating members.

15. The display device of claim 14, wherein the first conductive layer comprises a gate electrode of the thin film transistor in the display area and the first pad electrode disposed in the pad area, and wherein the second conductive layer comprises a source electrode and a drain electrode of the thin film transistor in the display area and the second pad electrode disposed in the pad area.

16. The display device of claim 15, wherein the display pad disposed in the pad area further comprises the first insulating layer disposed between the first pad electrode and the second pad electrode, wherein the first insulating layer exposes a part of a top surface of the first pad electrode.

17. The display device of claim 14, further comprising:

a first via layer disposed on the second conductive layer in the display area;

a third conductive layer disposed on the first via layer;

a second via layer disposed on the third conductive layer;

a light emitting element layer disposed on the second via layer and comprising a fourth conductive layer; and a sensing unit disposed on the light emitting element layer, wherein the sensing unit comprises a first buffer layer, a first sensing insulating layer disposed on the first buffer layer, a fifth conductive layer disposed on the first sensing insulating layer, and a second sensing insulating layer disposed on the fifth conductive layer, wherein the display pad disposed in the pad area further comprises:

a second buffer layer disposed between the substrate and the first pad electrode, a third pad electrode disposed between the first pad electrode and the second pad electrode and in contact with the first pad electrode, the second insulating layer disposed between the first pad electrode and the third pad electrode, exposing a part of a top surface of the first pad electrode, and in contact with the first pad electrode and the third pad electrode, and a fourth pad electrode disposed between the second pad electrode and the third pad electrode and in contact with the second pad electrode, wherein the first pad electrode, the second pad electrode, the third pad electrode, and the fourth pad electrode overlap each other in the plan view, and wherein the first pad electrode, the second pad electrode, the third pad electrode, and the fourth pad electrode are electrically connected.

18. The display device of claim 17, wherein the first conductive layer comprises a gate electrode of the thin film transistor in the display area and the first pad electrode disposed in the pad area, wherein the second conductive layer comprises a source electrode and a drain electrode of the thin film transistor in the display area and the third pad electrode disposed in the pad area, wherein the third conductive layer comprises a data line connected to the source electrode of the thin film transistor in the display area, a connection electrode connected to the drain electrode of the thin film transistor, and the fourth pad electrode disposed in the pad area, and wherein the fifth conductive layer comprises a driving electrode and a sensing electrode of the sensing unit in the display area, and the second pad electrode disposed in the pad area.

19. The display device of claim 18, wherein the display pad disposed in the pad area further comprises the first buffer layer and the first sensing insulating layer disposed between the second pad electrode and the fourth pad electrode, wherein the first buffer layer and the first sensing insulating layer are in contact with the second pad electrode, and wherein the first sensing insulating layer is in contact with the insulating members.

20. The display device of claim 19, wherein the display pad further comprises a fifth pad electrode disposed between the second pad electrode and the fourth pad electrode, wherein the fourth conductive layer comprises an anode electrode of the light emitting element layer connected to the connection electrode of the display area and the fifth pad electrode disposed in the pad area, and wherein the first buffer layer is in contact with the fifth pad electrode while exposing a part of a top surface of the fifth pad electrode.

* * * * *